(12) United States Patent
Nakata et al.

(10) Patent No.: US 7,177,148 B2
(45) Date of Patent: Feb. 13, 2007

(54) OUTDOOR-INSTALLED POWER CONDITIONER DEVICE

(75) Inventors: Hirofumi Nakata, Nara (JP); Naoto Hirose, Soraku-gun (JP); Yukitaka Sakamoto, Sanda (JP)

(73) Assignees: Sharp Kabushiki Kaisha, Osaka (JP); Tabuchi Electric Co., Ltd., Osaka (JP)

( * ) Notice: Subject to any disclaimer, the term of this patent is extended or adjusted under 35 U.S.C. 154(b) by 201 days.

(21) Appl. No.: 10/517,255

(22) PCT Filed: Jun. 19, 2003

(86) PCT No.: PCT/JP03/07832

§ 371 (c)(1),
(2), (4) Date: Dec. 7, 2004

(87) PCT Pub. No.: WO04/002205

PCT Pub. Date: Dec. 31, 2003

(65) Prior Publication Data

US 2006/0012947 A1 Jan. 19, 2006

(30) Foreign Application Priority Data

Jun. 24, 2002 (JP) .............................. 2002-182759
Jul. 17, 2002 (JP) .............................. 2002-208637
May 30, 2003 (JP) .............................. 2003-155221

(51) Int. Cl.
*H05K 7/20* (2006.01)
*A47B 81/00* (2006.01)

(52) U.S. Cl. ...................... 361/695; 361/690; 361/692; 361/694; 174/16.1; 174/52.1; 312/223.1

(58) Field of Classification Search ..................... None
See application file for complete search history.

(56) References Cited

U.S. PATENT DOCUMENTS 4,291,817 A 9/1981 Spitzer et al.

(Continued)

FOREIGN PATENT DOCUMENTS

EP 0 961 377 A1 12/1999

(Continued)

OTHER PUBLICATIONS

International Preliminary Examination Report mailed Oct. 20, 2003 in corresponding PCT Application No. PCT/JP03/07832.

(Continued)

*Primary Examiner*—Boris Chervinsky
(74) *Attorney, Agent, or Firm*—Nixon & Vanderhye, P.C.

(57) ABSTRACT

An enclosure is formed of an outer case and a lid. The outer case includes a first projecting strip portion provided on a top face side of the outer case and on an outer peripheral portion defining an opening, and extending to project outwardly from the outer case, and the lid includes a second projecting strip portion provided at a position facing the first projecting strip portion. With the opening of the outer case closed with the lid, the first and second projecting strip portions make close contact with each other along a direction in which these portions extend. This structure can protect the inside from an external factor such as rainwater or dust.

20 Claims, 18 Drawing Sheets

U.S. PATENT DOCUMENTS

| | | | | |
|---|---|---|---|---|
| 4,949,218 A | * | 8/1990 | Blanchard et al. | 361/696 |
| 6,107,567 A | * | 8/2000 | Blalock | 174/58 |
| 6,242,697 B1 | * | 6/2001 | Gerken et al. | 174/666 |
| 6,657,861 B2 | * | 12/2003 | Irmer | 361/695 |
| 6,677,519 B2 | * | 1/2004 | Rumsey et al. | 174/50 |
| 6,788,535 B2 | * | 9/2004 | Dodgen et al. | 361/695 |
| 6,932,443 B1 | * | 8/2005 | Kaplan et al. | 312/213 |
| 2001/0052412 A1 | * | 12/2001 | Tikka | 165/299 |

FOREIGN PATENT DOCUMENTS

| | | |
|---|---|---|
| EP | 1 077 515 A1 | 2/2001 |
| JP | 57-141605 | 9/1982 |
| JP | 1-40247 Y2 | 12/1989 |
| JP | 4-72807 U | 6/1992 |
| JP | 5-31296 U | 4/1993 |
| JP | 5-43705 U | 6/1993 |
| JP | 6-141418 A | 5/1994 |
| JP | 2813175 B2 | 8/1998 |
| JP | 11-121955 A | 4/1999 |
| JP | 11-122933 A | 4/1999 |
| JP | 11-122949 A | 4/1999 |
| JP | 3097473 B2 | 8/2000 |

OTHER PUBLICATIONS

International Search Report mailed Jul. 29, 2003 in corresponding PCT Application No. PCT/JP03/07832.

* cited by examiner

OUTDOOR-INSTALLED POWER CONDITIONER DEVICE

This application is the US national phase of international application of PCT/JP03/07832 filed 19 Jun. 2003 which claims priority of JP 2002-182759 filed Jun. 24, 2002; JP 2002-208637 filed Jul. 17, 2002; and 2003-155221 filed May 30, 2003, the entire contents of which are hereby incorporated by reference.

TECHNICAL FIELD

The present invention relates to an outdoor-installed power conditioner converting direct current (DC) power produced by an independent DC power supply into alternating current (AC) power to supply the power to a general AC load for home and business use or to an existing commercial power system.

BACKGROUND ART

A solar battery is known as a simple and clean energy source without emitting toxic substances. Exposed to sunlight, it operates as a DC power supply and outputs DC power. A power conditioner for photovoltaic power generation system serves to convert DC power generated by a solar battery into AC power to supply the power to a general AC load or to an existing commercial power system. Since the solar battery is installed at a location receiving sunlight, such as on a roof of a house, the power conditioner for photovoltaic power generation system is also installed outdoors in many cases.

To protect such an outdoor-installed power conditioner from external factors such as rainwater, dust or impact, an enclosure is used to house the outdoor-installed power conditioner. FIG. 22 is a perspective view showing an enclosure for a conventional outdoor-installed power conditioner.

Referring to FIG. 22, an enclosure 201 for an outdoor-installed power conditioner includes an outer case 202 housing the power conditioner and a lid 203. Outer case 202 is open at its one side face, and lid 203 is used to close the opening. Lid 203 is fastened to outer case 202 from the opening front side of outer case 202, with a plurality of screws 204.

FIG. 23 is a front view showing the outdoor-installed power conditioner housed in the outer case in FIG. 22. Referring to FIG. 23, outer case 202 houses an input/output terminal pad 207 for connecting interconnections from a commercial power system 209 and a DC power supply 208, and a power converter 206 for converting DC power into AC power. When carrying out electric work for connecting the interconnections from DC power supply 208 and commercial power system 209, screws 204 are loosened to remove lid 203 from outer case 202, and then the work is carried out.

However, in enclosure 201 for the conventional outdoor-installed power conditioner, the number of screws 204 used for fastening should be increased to achieve closer contact between outer case 202 and lid 203 to prevent rainwater or the like from infiltrating into the inside from a gap between the attachment faces of outer case 202 and lid 203. Such an increase in the number of screws 204 causes problems of an increase in manufacturing cost and a decrease in workability of attaching lid 203 to outer case 202.

In addition, in enclosure 201 for the outdoor-installed power conditioner, since lid 203 is fastened with screws 204 from the front side of enclosure 201, the appearance of enclosure 201 is spoiled.

Further, when lid 203 is removed from outer case 202 for carrying out the work for connecting the interconnections, power converter 206 will become exposed since lid 203 has the same size as that of the opening of outer case 202. If the work for connecting the interconnections is carried out in such a situation, the worker may accidentally touch or damage power converter 206. Furthermore, a foreign matter such as dust is more likely to enter the inside of outer case 202 during the work for connecting the interconnections.

The following is another conventional outdoor-installed power conditioner. FIG. 24 is a perspective view showing an appearance of the conventional outdoor-installed power conditioner.

Referring to FIG. 24, an outdoor-installed power conditioner 301 includes an outer case 302, a lid 304 closing an opening provided on the front side of outer case 302, and a mounting plate 303. Outdoor-installed power conditioner 301 is installed outdoors with mounting plate 303 mounted on an outer wall of a building. An intake vent 305 is provided in a bottom face 302a of outer case 302, and an exhaust vent 306 is provided in a rear face 302b of outer case 302. Intake vent 305 is provided with rectangular holes arranged in a plurality of rows. Mounting plate 303 is provided on rear face 302b of outer case 302 in communication with exhaust vent 306, and a slit portion 307 is provided in its side face.

FIG. 25 is a cross-sectional view along the line XXV—XXV in FIG. 24. Referring to FIG. 25, a power converter 335 converting DC power output from a solar battery or the like into AC power is provided within outer case 302. A power element 314, which is the most heat generating element in power converter 335, is provided so as to contact a surface of a heat sink 311 attached on bottom face 302a of outer case 302.

In an upper part of outer case 302, a fan supporting portion 317 is fastened on rear face 302b of outer case 302 with a screw 318. A fan 316 is fastened to fan supporting portion 317 with screws 315a and 315b so as to be located between fan supporting portion 317 and heat sink 311. A rotary blade is provided within fan 316, blowing air in a direction indicated by an arrow 331. The air introduced by fan 316 into fan supporting portion 317 flows in a direction indicated by an arrow 332 and is exhausted from exhaust vent 306. Fan 316 is provided such that the direction indicated by arrow 331 and the direction indicated by arrow 332 form an angle β of 90°.

Rear face 302b of outer case 302 is provided with an upper hook portion 320, a middle hook portion 333, and a lower screw-fastened portion 319. Outer case 302 is fixed to mounting plate 303 by locking these portions to facing portions of mounting plate 303 and fastening them with screws.

FIG. 26 is a cross-sectional view along the line XXVI—XXVI in FIG. 24. With reference to FIG. 26, a cooling structure of conventional outdoor-installed power conditioner 301 will now be described.

Referring to FIG. 26, outside cool air is taken in from intake vent 305 provided in bottom face 302a of outer case 302 into heat sink 311 by operating a rotary blade 329 within fan 316. The inside of heat sink 311 is divided into a plurality of chambers by blade portions extending vertically, and the air passes through each chamber formed in this manner. Since the heat generated at power element 314 has been conducted to the blade portions of heat sink 311, the air passes in contact with the blade portions within heat sink 311 and removes the heat of the blade portions. As a result, power converter 335 is cooled down.

The air heated by heat exchange with the blade portions within heat sink 311 moves to an upper part of heat sink 311, passes through an aperture 323 provided in a bottom face of fan 316 and an aperture 324 provided in a bottom face of fan supporting portion 317, and is blown into fan supporting portion 317. The air blown into fan supporting portion 317 first strikes against an upper face of fan supporting portion 317. About 50 percent of the air striking against the upper face flows in a direction toward exhaust vent 306 indicated by an arrow 326, and the remaining 50 percent flows in a direction opposite to exhaust vent 306 indicated by an arrow 327 and circulates within fan supporting portion 317.

The air exhausted from exhaust vent 306 passes through a space formed by mounting plate 303 and is exhausted from slit portion 307. Since the air flows in a direction indicated by an arrow 328 in this case, it first strikes against mounting plate 303 and is exhausted from slit portion 307 to the outside of outdoor-installed power conditioner 301.

In the cooling structure actively taking in outside cool air to air-cool the inside with the air as described above, air used for heat exchange should readily be exhausted outside the conditioner. Further, the enclosure for an outdoor-installed power conditioner should protect the electronics provided in the enclosure from external factors such as rainwater or dust. Furthermore, since the fan taking in outside air is driven by a motor and is a consumable, it is to be replaced at the end of its life. Thus, maintenance of the fan should be performed easily.

However, in conventional outdoor-installed power conditioner 301, the direction in which the air blown out by fan 316 flows is relatively perpendicular to the direction in which the air exhausted from exhaust vent 306 flows, and thus the air taken in by fan 316 is not efficiently exhausted to the outside of outer case 302. Further, also within mounting plate 303, the air first strikes against mounting plate 303, and thus is not efficiently exhausted from slit portion 307 to the outside of outdoor-installed power conditioner 301. Due to the above-mentioned reasons, efficiency for cooling power converter 335 in heat sink 311 may be reduced, leading to the possibility of an increase in the temperature of power converter 335 not being suppressed sufficiently.

Further, if opening areas of intake vent 305 and exhaust vent 306 are enlarged in an attempt to take in more air to the inside of outer case 302 and improve cooling efficiency, rainwater may infiltrate into outer case 302 from intake vent 305 and exhaust vent 306 during a rainstorm or the like.

Furthermore, when fan 316 is to be removed from outer case 302 for its maintenance, interference of heat sink 311 and power converter 335 when removing screws 315*a* and 315*b* is troublesome. Therefore, firstly, screw 318 should be unfastened to remove fan supporting portion 317 from outer case 302, and then screws 315*a* and 315*b* should be unfastened to remove fan 316 from fan supporting portion 317. Performing such a work takes time and effort, degrading workability during the maintenance of fan 316.

Still another conventional outdoor-installed power conditioner is disclosed in Japanese Patent Laying-Open No. 11-122949. The power conditioner includes an enclosure, and an exhaust vent is provided in a rear face of the enclosure. Cooling wind cooling a power supply apparatus within the enclosure is exhausted from the exhaust vent. The enclosure is mounted via a wall-hung plate attached on an outer wall surface. Here, a spacer piece is provided between the wall-hung plate and the rear face of the enclosure, which forms a gap between the exhaust vent and the outer wall surface to prevent the exhaust vent from being blocked by the outer wall.

In the above power conditioner, the cooling wind is exhausted from the exhaust vent provided in the rear face of the enclosure. Since the periphery of the exhaust vent is open to the outside, rainwater may easily infiltrate from the exhaust vent into the enclosure. Further, when trash such as fallen leaves accumulates between the rear face of the enclosure and the outer wall surface, the exhaust vent may be clogged by the trash.

DISCLOSURE OF THE INVENTION

A first object of the invention is to provide an enclosure for an outdoor-installed power conditioner which effectively protects the outdoor-installed power conditioner from an external factor such as rainwater or dust and is excellent in appearance and workability during maintenance.

A second object of the invention is to provide an outdoor-installed power conditioner which efficiently exhausts air taken into the conditioner via a fan, prevents rainwater from infiltrating into the conditioner from an intake vent and an exhaust vent, and is excellent in workability during maintenance of the fan.

A third object of the invention is to provide an outdoor-installed power conditioner capable of securing an exhaust channel reliably and preventing rainwater infiltration into its inside.

An outdoor-installed power conditioner according to the present invention includes an enclosure housing a power converter therein. The enclosure includes an outer case having a side face provided with an opening for housing the power converter, and a lid for closing the opening. The outer case includes a first projecting strip portion provided on a top face side of the outer case and on an outer peripheral portion defining the opening, and extending with projecting outwardly from the outer case. The lid includes a second projecting strip portion provided at a position facing the first projecting strip portion. With the opening of the outer case closed with the lid, the first and second projecting strip portions make close contact with each other along a direction in which the first and second projecting strip portions extend.

According to the outdoor-installed power conditioner formed as described above, since the first and second projecting strip portions are in close contact along the direction in which the first and second projecting strip portions extend, rainwater falling on a top face of the outdoor-installed power conditioner can be prevented from infiltrating into the enclosure from a gap between the outer case and the lid. In addition, by taking a structure in which the first or the second projecting strip portion is fitted into a concave portion partly formed by the other projecting strip portion to achieve close contact between the first and the second projecting strip portions, fixing means to fix the lid to the outer case can be omitted on the top face side. Thus, manufacturing cost can be reduced, and appearance of the outdoor-installed power conditioner can be improved.

Preferably, the outer peripheral portion is formed of a ribbed body, surrounding the opening and projecting from the side face provided with the opening. According to the outdoor-installed power conditioner formed as described above, strength in the opening of the outer case can be improved.

Preferably, the first projecting strip portion extends from one end to the other end of the outer peripheral portion provided with the first projecting strip portion. According to the outdoor-installed power conditioner formed as described above, rainwater falling on the top face of the outdoor-installed power conditioner can be guided to both sides of the outer peripheral portion. Since the rainwater guided to the both sides of the outer peripheral portion is guided downward by gravity and drained, it does not infiltrate into the enclosure.

Preferably, the first or the second projecting strip portion includes a portion guiding the other projecting strip portion when the opening of the outer case is closed with the lid. According to the outdoor-installed power conditioner formed as described above, since one projecting strip portion is guided by the other projecting strip portion when the opening of the outer case is closed with the lid, the first and the second projecting strip portions can be brought into close contact smoothly. Therefore, workability in attaching the lid to the outer case can be improved. Further, such a structure can prevent a case where a worker mistakenly thinks that the lid is attached at an appropriate position and thus rainwater infiltrates from a gap made on that occasion into the enclosure.

Preferably, the lid further includes first fixing means provided in a face other than a face facing the opening to fix the lid to the outer case. According to the outdoor-installed power conditioner formed as described above, since the first fixing means is provided in a face other than the face facing the opening, the appearance of the outdoor-installed power conditioner can be improved.

Preferably, the outdoor-installed power conditioner includes the power converter requiring no maintenance work and a maintenance portion requiring maintenance work, and the lid includes a first portion closing the power converter and a second portion closing the maintenance portion. According to the outdoor-installed power conditioner formed as described above, when performing maintenance for the outdoor-installed power conditioner, required work can be performed by removing only the second portion closing the maintenance portion requiring maintenance work. This can prevent a foreign material such as dust from entering the inside of the enclosure. Further, this can prevent a worker from accidentally touching or damaging the power converter requiring no maintenance work while working.

Preferably, second fixing means fixing the first portion to the outer case is covered with the second portion. According to the outdoor-installed power conditioner formed as described above, since the second fixing means fixing the first portion is covered with the second portion and thus not discernible in appearance, the appearance of the enclosure can be improved. Further, since the first and the second portions are adjacent to each other so as to completely close up the outer case, covering the second fixing means with the second portion in this manner can easily be achieved.

Preferably, the second portion is provided lower than the first portion, and each of the first and second portions has an edge confronting each other. The edge of the second portion is bent toward the inside of the enclosure to form an inclined face, and the inclined face is located on a line extending from the edge of the first portion. According to the outdoor-installed power conditioner formed as described above, rainwater falling down from an outer surface of the first portion can be prevented from infiltrating into the enclosure from a gap formed at a position where the first and the second portions confront each other.

Preferably, the enclosure includes an intake vent and a first exhaust vent, and a fan cooling down the power converter is provided in the enclosure. The fan blows air taken in from the intake vent to flow through the power converter to the first exhaust vent. The fan is inclined with respect to the first exhaust vent such that a direction in which the air blown out from the fan flows and a direction in which the air exhausted from the first exhaust vent flows form an acute angle.

According to the outdoor-installed power conditioner formed as described above, the air taken in from the intake vent by the fan cools down the power converter as a heat source of the outdoor-installed power conditioner. Since the relative position of the fan with respect to the first exhaust vent is determined such that the direction in which the air blown out from the fan flows and the direction in which the air exhausted from the first exhaust vent flows form an acute angle, the air used for heat exchange with the power converter is efficiently exhausted from the first exhaust vent out of the enclosure. This can suppress an increase in the temperature of the power converter provided within the enclosure.

Preferably, the outdoor-installed power conditioner further includes an exhaust channel forming member communicating with the first exhaust vent and provided adjacent to the enclosure. The exhaust channel forming member includes a second exhaust vent for exhausting the air exhausted from the first exhaust vent out of the outdoor-installed power conditioner. According to the outdoor-installed power conditioner formed as described above, since the exhaust channel forming member is provided adjacent to the enclosure so as to cover the first exhaust vent, this structure can prevent outside rainwater from infiltrating directly from the first exhaust vent into the enclosure. Thus, electronics such as the power converter provided within the enclosure can be protected from rainwater.

Preferably, the outdoor-installed power conditioner further includes an exhaust guide guiding the air from the first exhaust vent toward the second exhaust vent. According to the outdoor-installed power conditioner formed as described above, since the air exhausted from the first exhaust vent is guided toward the second exhaust vent by the exhaust guide, the air can efficiently be exhausted out of the outdoor-installed power conditioner. This can further suppress an increase in the temperature of the power converter provided within the enclosure.

Preferably, the outdoor-installed power conditioner further includes a waterproof member formed on the inside of the enclosure to cover the intake vent. The waterproof member includes an intake guide guiding the air from the intake vent toward the power converter. According to the outdoor-installed power conditioner formed as described above, rainwater can be prevented from infiltrating from the intake vent into the enclosure during a rainstorm or the like. Thus, electronics such as the power converter provided within the enclosure can be protected from rainwater. Further, since the waterproof member has the intake guide, the air taken in from the intake vent into the enclosure can be guided toward the power converter as a heat source. By effectively guiding outside cool air toward the power converter in this manner, an increase in the temperature of the power converter can further be suppressed.

Preferably, the fan is mounted to be directly attachable to and detachable from the enclosure. According to the outdoor-installed power conditioner formed as described above, the fan can easily be removed from the enclosure when, for example, a motor connected to the fan reaches the end of its life. Thus, the fan can easily be replaced, improving workability in maintenance of the fan.

Preferably, the enclosure has an intake vent and a first exhaust vent, and the enclosure is provided with a fan blowing air taken in from the intake vent to flow through the power converter to the first exhaust vent to cool down the power converter. An exhaust channel forming member is connected to the enclosure, and the exhaust channel forming member communicates with the first exhaust vent to form an exhaust channel therein, and has a second exhaust vent for exhausting the air within the exhaust channel outside. The exhaust channel forming member has a top face inclined so as to become lower in level with distance from the enclosure.

According to the outdoor-installed power conditioner formed as described above, an exhaust channel from the first exhaust vent provided in the enclosure can reliably be secured by means of the exhaust channel forming member. Further, infiltration of rainwater or the like into the first exhaust vent can be prevented by the exhaust channel forming member. Furthermore, the top face of the exhaust channel forming member is inclined so as to become lower in level with distance from the enclosure, allowing rainwater to immediately run down to the side opposite to the outer case without accumulating on the top face of the exhaust channel forming member. Even when there is a joint between the exhaust channel forming member and the enclosure, rainwater infiltration from the joint can be prevented. For these reasons, an exhaust channel can be secured and electronics within the enclosure can be protected from rainwater.

Preferably, the second exhaust vent is located lower than the first exhaust vent, and a first water stop member projecting toward the exhaust channel is provided along a lower end portion of the first exhaust vent. According to the outdoor-installed power conditioner formed as described above, rainwater infiltration into the enclosure can be suppressed by the first water stop member even when the rainwater fanned by wind infiltrates through the second exhaust vent into the exhaust channel during a rainstorm or the like.

Preferably, a second water stop member is provided to project toward a position lower than the first water stop member in the exhaust channel, and the second water stop member is provided on a face facing a face provided with the first water stop member. According to the outdoor-installed power conditioner formed as described above, the second water stop member makes rainwater infiltration into the enclosure more difficult.

Preferably, the second water stop member is inclined to form a substantially right angle with respect to the top face of the exhaust channel forming member. According to the outdoor-installed power conditioner formed as described above, the heated air exhausted from the first exhaust vent can smoothly be guided into the exhaust channel.

Preferably, the second exhaust vent is located in each of a right side face and a left side face of the exhaust channel forming member. Comparing an exhaust route formed between the second exhaust vent in the right side face and a right end of the first exhaust vent with an exhaust route formed between the second exhaust vent in the left side face and a left end of the first exhaust vent, a portion of the second water stop member located on the exhaust route having a longer distance is formed to project longer than a portion of the second water stop member located on the exhaust route having a shorter distance. According to the outdoor-installed power conditioner formed as described above, rainwater infiltration into the enclosure can be suppressed while minimizing an adverse effect on exhaust efficiency by the second water stop member.

Preferably, the enclosure is mounted on a joining surface by locking the enclosure to the exhaust channel forming member fixed on the joining surface. According to the outdoor-installed power conditioner formed as described above, the enclosure can be mounted on the joining surface by means of the exhaust channel forming member, and securing of an exhaust channel and attachment of the enclosure can be performed at the same time.

Preferably, the air exhausted from the first exhaust vent is guided by a backside of an inclined top panel forming the top face of the exhaust channel forming member, and introduced to a lower part of the exhaust channel. According to the outdoor-installed power conditioner formed as described above, the exhausted air can smoothly be guided to the lower part of the exhaust channel by means of the inclined top panel. Further, the number of members required can be reduced, compared with the case where such a guide member is provided separately.

BRIEF DESCRIPTION OF THE DRAWINGS

FIG. 16A is a front view, FIG. 16B is a side view, FIG. 16C is a bottom view, and FIG. 16D is a top view.

BEST MODES FOR CARRYING OUT THE INVENTION

In the following, embodiments of the present invention will be described with reference to the drawings.

First Embodiment

Figure 1:
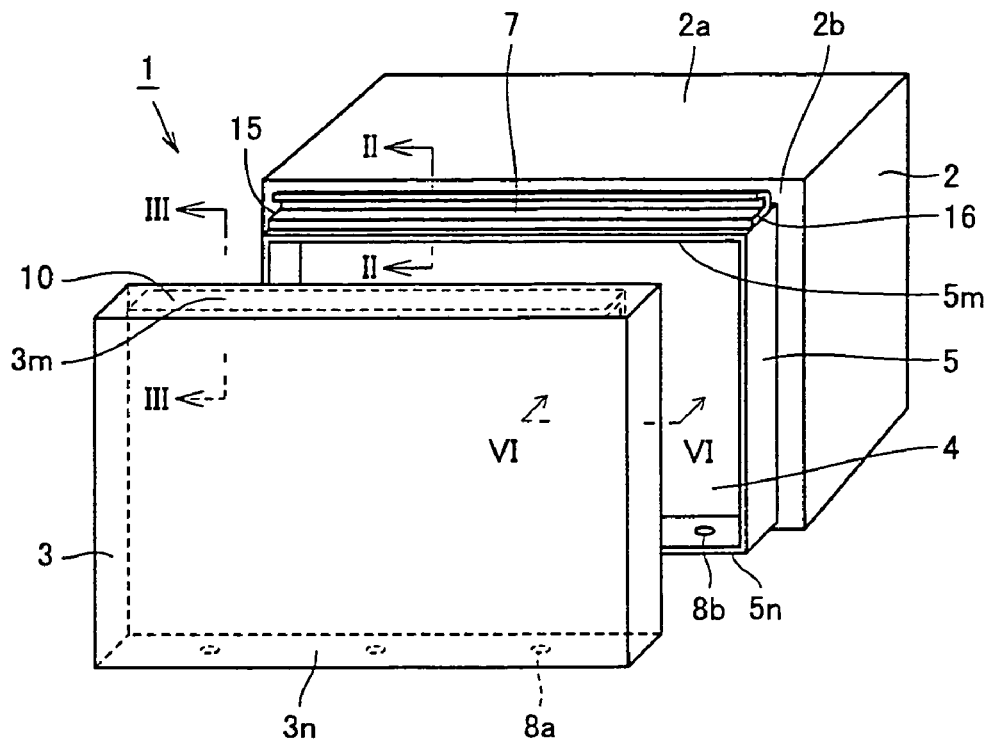
FIG. 1 is a perspective view showing an enclosure for an outdoor-installed power conditioner in a first embodiment of the present invention.

FIG. 1 is a perspective view showing an enclosure for an outdoor-installed power conditioner in a first embodiment of the present invention. Referring to FIG. 1, an enclosure 1 housing a power converter installed outdoors includes an outer case 2 and a lid 3. Outer case 2 and lid 3 are made of a metal material. Outer case 2 and lid 3 are formed so as to have equal-sized attachment faces to eliminate difference in level on the surface of enclosure 1, improving the appearance of enclosure 1.

An opening 4 is provided in a front face 2b, one of the four side faces of outer case 2. Along the periphery of opening 4, an outer peripheral portion 5 is formed so as to project from front face 2b. On a top face 5m of outer peripheral portion 5, a plate member 7 is provided extending from one end 15 to the other end 16 of top face 5m. In a bottom face 5n of outer peripheral portion 5, a plurality of screw holes 8b for fastening lid 3 to outer case 2 are formed. It is to be noted that, although outer peripheral portion 5 is formed along the periphery of opening 4 and plate member 7 is provided on outer peripheral portion 5 in the present embodiment, outer peripheral portion 5 may not be formed and plate member 7 may be directly attached on front face 2b defining opening 4, on a side close to top face 2a. In addition, means for fastening lid 3 to outer case 2 is not limited to screws, and may be a structure employing fit.

On a top face 3m of lid 3, a plate member 10 is provided at a position facing plate member 7 when lid 3 is attached to outer case 2. In a bottom face 3n of lid 3, a plurality of holes 8a identified as first fixing means are provided at positions corresponding to screw holes 8b when lid 3 is attached to outer case 2.

Figure 2:
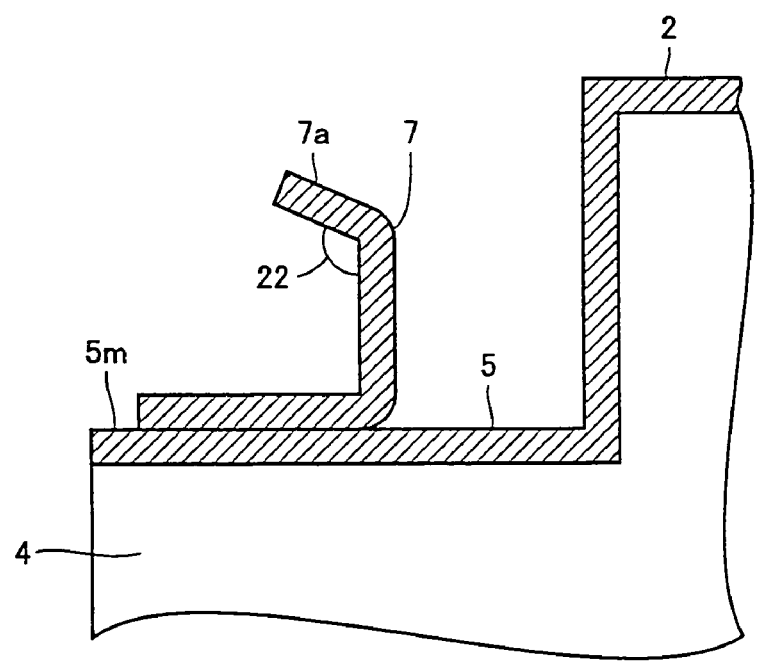
FIG. 2 is a cross-sectional view along the line II—II in FIG. 1.

FIG. 2 is a cross-sectional view along the line II—II in FIG. 1. Referring to FIG. 2, plate member 7 extends as projecting from top face 5m of outer peripheral portion 5, and then it is directed toward opening 4 to form a bent guide portion 7a. On this occasion, a bent angle 22 is larger than 90°, and guide portion 7a is formed to be inclined. Plate member 7 is attached to outer peripheral portion 5 by spot welding.

Figure 3:
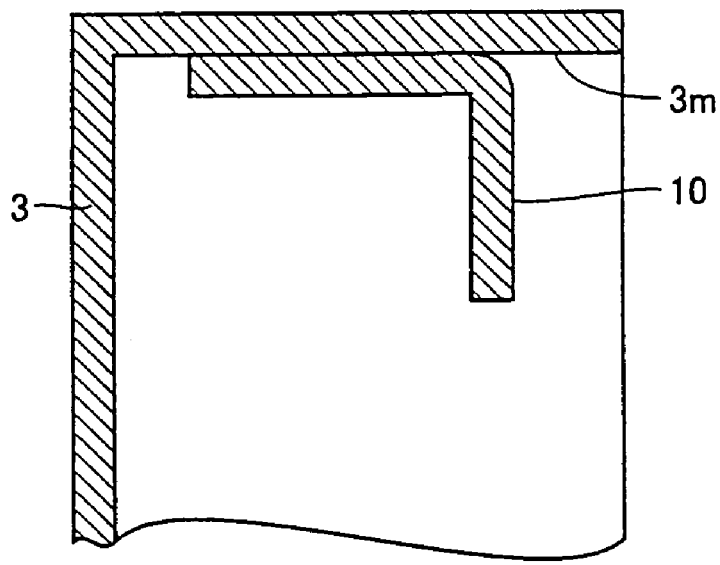
FIG. 3 is a cross-sectional view along the line III—III in FIG. 1.

FIG. 3 is a cross-sectional view along the line III—III in FIG. 1. Referring to FIG. 3, plate member 10 extends as projecting inwardly from top face 3m of lid 3. Plate member 10 is attached to lid 3 by spot welding.

Figure 4:
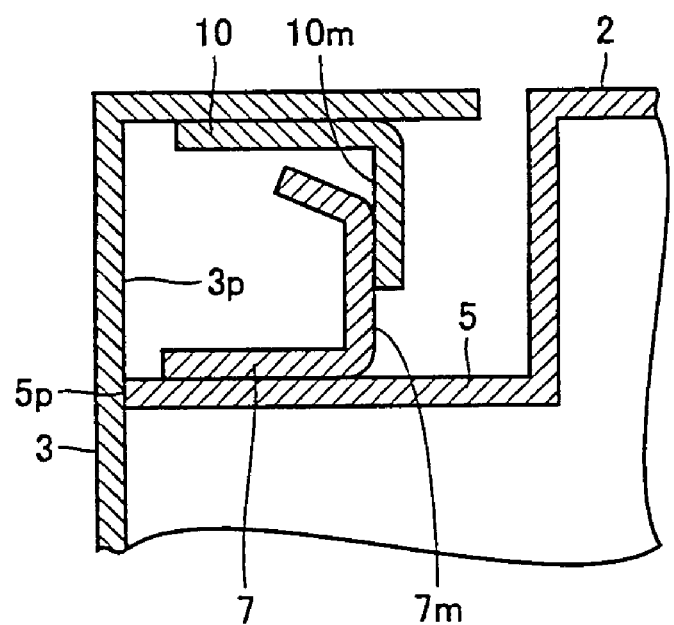
FIG. 4 is a cross-sectional view showing a condition in which a lid is attached to an outer case in the enclosure of FIG. 1.

FIG. 4 is a cross-sectional view showing a condition in which the lid is attached to the outer case in the enclosure of FIG. 1. FIG. 4 shows a cross-sectional view of a portion where plate members 7 and 10 closely contact. Referring to FIG. 4, a rear face 3p of lid 3 and a face 10m of plate member 10 facing rear face 3p form a concave portion. An end face 5p of outer peripheral portion 5 and a face 7m of plate member 7 facing face 10m form a convex portion. With lid 3 attached to outer case 2, the concave portion of lid 3 is inserted to the convex portion of outer case 2 formed in this manner. As a result, face 7m of plate member 7 and face 10m of plate member 10 are brought into close contact. Further, since plate members 7 and 10 are located as facing each other and their sectional shape is identical from one end 15 to the other end 16, close contact is achieved across one end 15 to the other end 16.

It is to be noted that a waterproof packing member having weather resistance may be affixed to face 7m or 10m to further achieve closer contact between face 7m of plate member 7 and face 10m of plate member 10. When using the waterproof packing member, it has an effect of preventing faces 7m and 10m from being damaged by the contact with each other.

Figure 5:
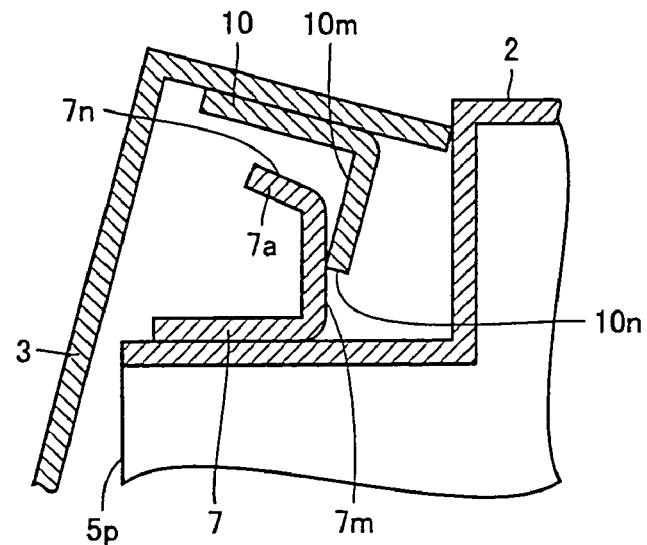
FIG. 5 is a cross-sectional view showing a process of attaching the lid to the outer case in the enclosure of FIG. 1.

FIG. 5 is a cross-sectional view showing a process of attaching the lid to the outer case in the enclosure of FIG. 1. The cross section shown in FIG. 4 corresponds to that shown in FIG. 4. Referring to FIG. 5, when lid 3 is to be attached to outer case 2, firstly, an end face 10n of plate member 10 comes into contact with a guide face 7n of guide portion 7a. Since guide face 7n is inclined, end face 10n is guided smoothly from guide face 7n to face 7m. On this occasion, lid 3 moves in an inclined condition to coincide with the inclination of guide face 7n. Thereafter, when the top face of lid 3 and the top face of outer case 2 come to have an identical height, a lower part of lid 3 is pushed in toward outer case 2. Through the procedure set forth above, lid 3 can be attached to outer case 2 to achieve close contact between face 7m of plate member 7 and face 10m of plate member 10.

Figure 6:
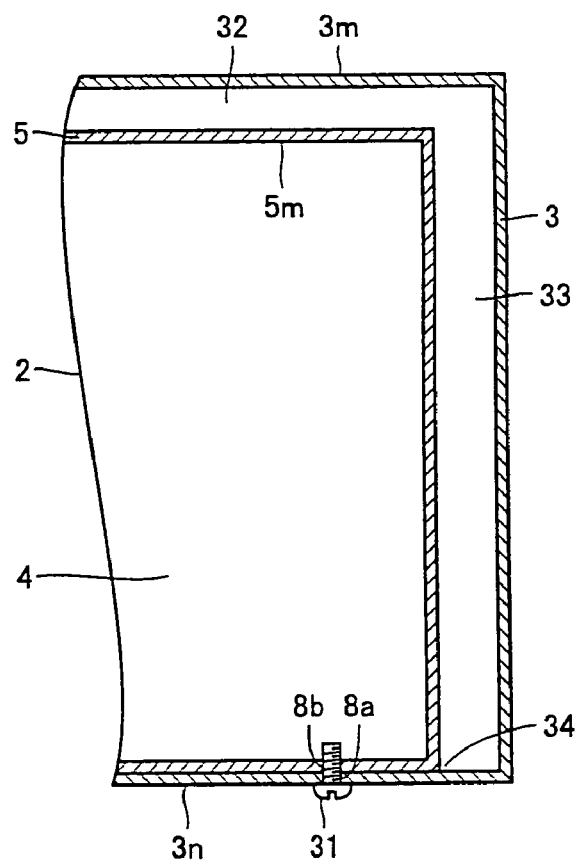
FIG. 6 is a cross-sectional view along the line VI—VI in FIG. 1, with the lid attached to the outer case.

FIG. 6 is a cross-sectional view along the line VI—VI in FIG. 1, with the lid attached to the outer case. Referring to FIG. 6, outer case 2 and lid 3 are fastened with a screw 31, using hole 8a and screw hole 8b. A space 32 is formed between top face 5m of outer peripheral portion 5 and top face 3m of lid 3. Similarly, a space 33 is formed on a side. Rainwater falling on enclosure 1 infiltrates through a gap between top face 2a of outer case 2 and top face 3m of lid 3 onto top face 5m of outer peripheral portion 5. However, since plate members 7 and 10 are in close contact with each other, the rainwater does not intrude into outer case 2. The rainwater passes through space 32 formed at the rear of plate members 7 and 10, and is guided to space 33 formed on both sides. Thereafter, it is drained out of enclosure 1 through a gap (not shown) from lid 3 provided at a corner portion 34 of outer peripheral portion 5.

Figure 7:
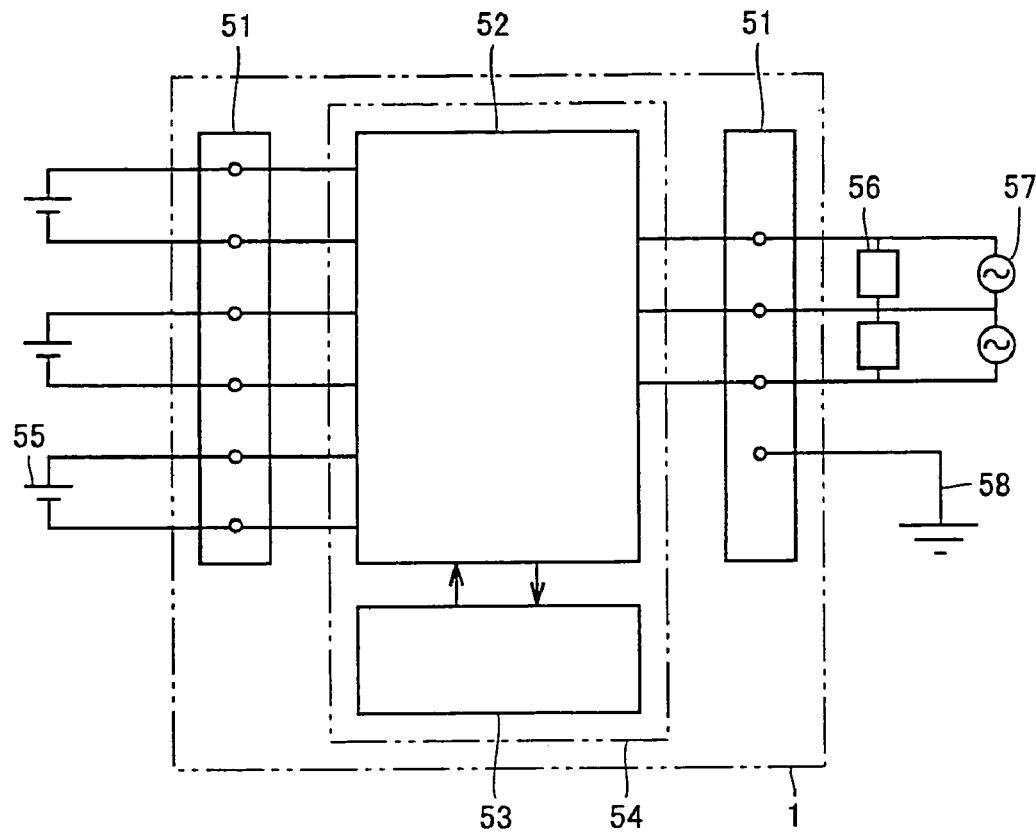
FIG. 7 is a circuit diagram of a power conditioner for a photovoltaic power generation system to be housed in the enclosure of FIG. 1.

FIG. 7 is a circuit diagram of a power conditioner for a photovoltaic power generation system to be housed in the enclosure of FIG. 1. Referring to FIG. 7, the power conditioner for a photovoltaic power generation system includes an input/output terminal pad 51 and a power converter 54. Power converter 54 includes a main circuit component 52 such as a switching element, and a control circuit component 53 such as a microcomputer. A DC power supply 55, a commercial power system 57 and an in-home electric load 56 are formed outside enclosure 1. Interconnections from DC power supply 55, commercial power system 57 and in-home electric load 56 and an interconnection from power converter 54 are connected to input/output terminal pad 51.

The power conditioner for a photovoltaic power generation system within enclosure 1 is grounded by means of an earth wire 58 via input/output terminal pad 51.

The power conditioner for a photovoltaic power generation system formed as described above converts DC power generated by a solar battery and output from DC power supply 55 into AC power at a frequency of 50/60 Hz in power converter 54. Then, it supplies the AC power to commercial power system 57 or in-home electric load 56.

Figure 8:
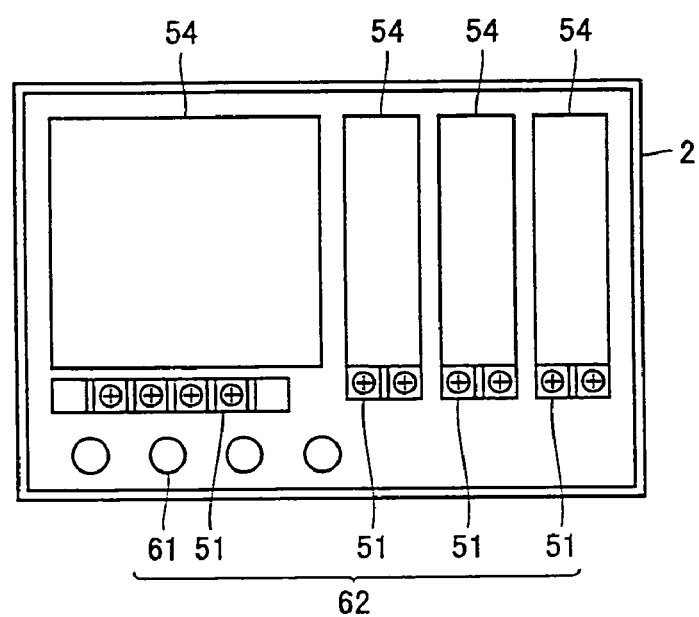
FIG. 8 is a front view showing the power conditioner for a photovoltaic power generation system housed in the outer case of FIG. 1.

FIG. 8 is a front view showing the power conditioner for a photovoltaic power generation system housed in the outer case of FIG. 1. Referring to FIG. 8, power converter 54 is mounted to an upper part of outer case 2, and input/output terminal pad 51 is mounted to a lower part of outer case 2. Further below input/output terminal pad 51, there are provided a plurality of interconnection holes 61 for guiding an interconnection from input/output terminal pad 51 to outside DC power supply 55, commercial power system 57 or in-home electric load 56.

It is to be noted that, although the present invention is applied to a power conditioner for a photovoltaic power generation system in the present embodiment, it may be applied to a power conditioner for another system using a DC power supply such as a fuel cell.

According to enclosure 1 for the outdoor-installed power conditioner formed as described above, plate members 7 and 10 are in close contact from one end 15 to the other end 16, preventing rainwater falling on enclosure 1 from infiltrating from top face 5m of outer peripheral portion 5 to the inside of outer case 2. Since the rainwater is guided downward through the both sides of outer peripheral portion 5 and drained, the power conditioner housed in enclosure 1 can be protected from the rainwater. In addition, since lid 3 is attached to outer case 2 from the bottom of enclosure 1, the attached part cannot be seen from the front side of enclosure 1 (from front face 2b in which the opening is provided). Thus, the appearance of enclosure 1 can be improved. Further, since plate members 7 and 10 are brought into close contact by inserting the concave portion formed by lid 3 to the convex portion formed by outer case 2, lid 3 does not have to be attached to outer case 2 by means of a screw or the like at the upper part of enclosure 1. Therefore, workability of attaching lid 3 to outer case 2 and the appearance of enclosure 1 can be improved. Furthermore, since guide portion 7a is provided on plate member 7, lid 3 can smoothly be attached to outer case 2. Therefore, workability of attaching lid 3 to outer case 2 can be improved. Further, such a structure can prevent a case where a worker mistakenly thinks that lid 3 is attached at an appropriate position and thus rainwater infiltrates from a gap made on that occasion into enclosure 1.

Second Embodiment

Figure 9:
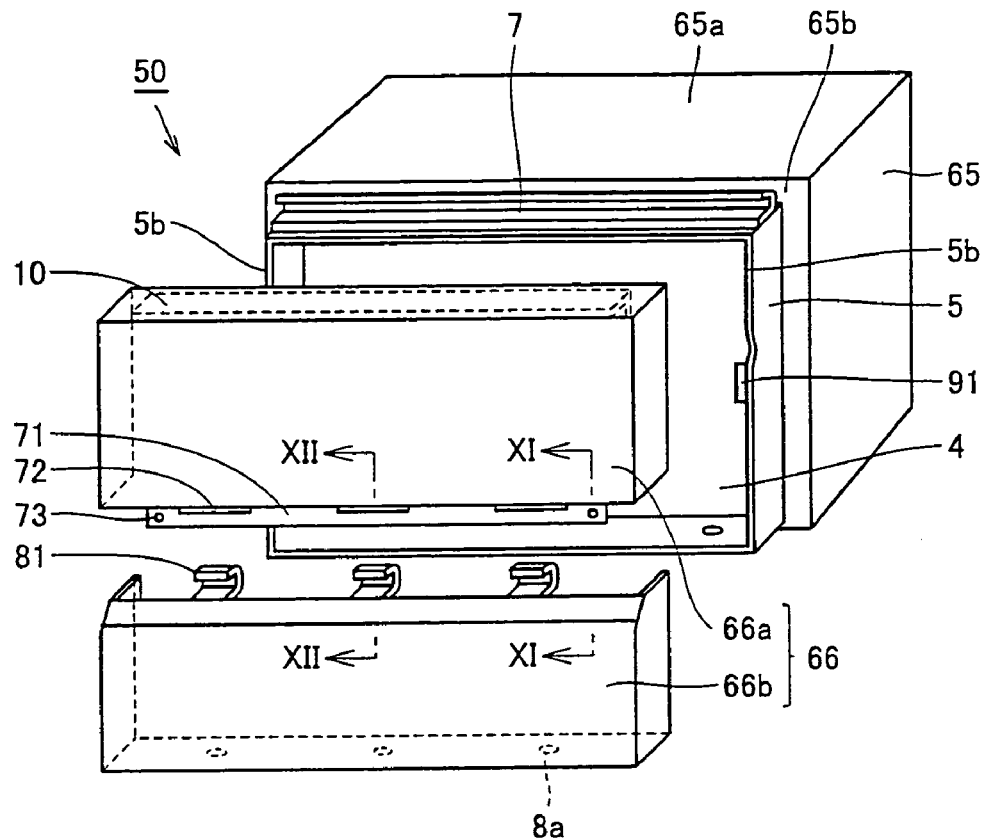
FIG. 9 is a perspective view showing an enclosure for an outdoor-installed power conditioner in a second embodiment of the present invention.

FIG. 9 is a perspective view showing an enclosure for an outdoor-installed power conditioner in a second embodiment of the present invention. Referring to FIG. 9, an enclosure 50 for a power conditioner for a photovoltaic power generation system includes an outer case 65 and a lid 66. Lid 66 includes a lid 66a as a first portion closing an upper part of outer case 65 and a lid 66b as a second portion closing a lower part of outer case 65. That is, lid 66b is provided at a position closer to the ground than lid 66a. Outer case 65 is identical to outer case 2 in the first embodiment except that a fastening plate 91 for attaching lid 66a is provided.

In lid 66a, a fastening plate 71 is provided at a position confronting lid 66b. On fastening plate 71, rectangular-shaped slits 72 are formed at a plurality of locations. At both ends of fastening plate 71, holes 73 for fastening lid 66a to outer case 65 are provided. Plate member 10 is provided as in lid 3 of the first embodiment. In lid 66b, a hooked portion 81 is formed at a position facing slit 72 formed in fastening plate 71 of lid 66a. Hole 8a is provided as in lid 3 of the first embodiment.

Figure 10:
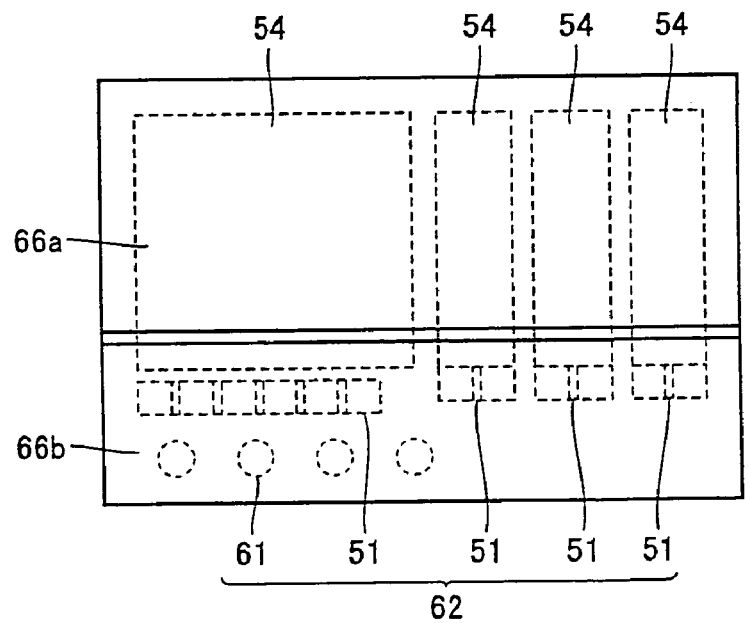
FIG. 10 is a front view showing a power conditioner for a photovoltaic power generation system housed in the enclosure of FIG. 9.

FIG. 10 is a front view showing the power conditioner for a photovoltaic power generation system housed in the enclosure of FIG. 9. Referring to FIG. 10, lid 66a closes power converter 54 constituting the power conditioner. Lid 66b closes input/output terminal pad 51 constituting the power conditioner, and interconnection hole 61. When performing installation work, measuring voltage and current at a periodic inspection, or the like, work must be performed at input/output terminal pad 51 and interconnection hole 61. Input/output terminal pad 51 and interconnection hole 61 will be referred to as a maintenance portion 62.

Figure 11:
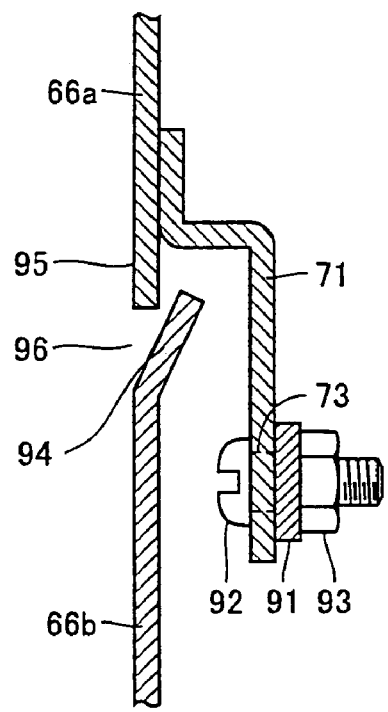
FIG. 11 is a cross-sectional view along the line XI—XI in FIG. 9, with a lid attached to an outer case.

FIG. 11 is a cross-sectional view along the line XI—XI in FIG. 9, with the lid attached to the outer case. FIG. 11 shows details of a portion in which lid 66a is fastened to outer case 65. Referring to FIG. 11, lids 66a and 66b have edges 95 and 96, respectively, at a position where lids 66a and 66b confront each other. Edge 96 of lid 66b is provided with an inclined face 94 formed so as to be directed toward the inside of enclosure 50 as it approaches lid 66a.

On a rear face of fastening plate 91 provided to outer case 65, a nut 93 is attached by crimping. With lid 66a attached to outer case 65, fastening plates 71 and 91 have face-to-face contact with each other. Via hole 73 provided in fastening plate 71, lid 66a is attached to outer case 65 by means of a screw 92 and nut 93 as second fixing means. After attaching lid 66a to outer case 65, lid 66b is attached to outer case 65. Since lid 66b is attached so as to cover screw 92 on this occasion, screw 92 is hidden by lid 66b when enclosure 50 is seen from the front side.

Figure 12:
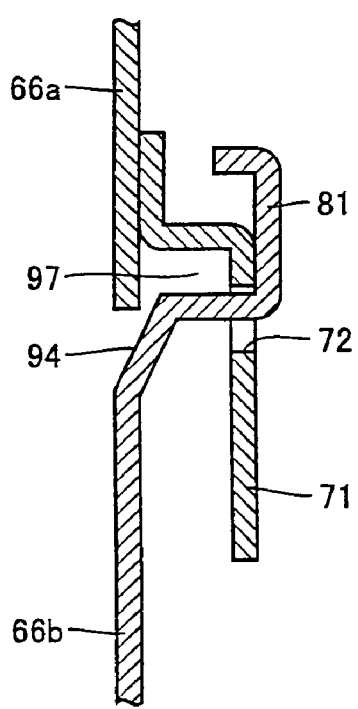
FIG. 12 is a cross-sectional view along the line XII—XII in FIG. 9, with the lid attached to the outer case.

FIG. 12 is a cross-sectional view along the line XII—XII in FIG. 9, with the lid attached to the outer case. Referring to FIG. 12, lid 66b is attached to outer case 65 with hooked portion 81 provided to lid 66b inserted into slit 72 provided in lid 66a. Thus, relative positional relation between lid 66a and lid 66b is fixed, more reliably preventing rainwater falling down lid 66a from infiltrating from a gap between lid 66a and lid 66b to the inside of enclosure 50.

It is to be noted that a waterproof packing member (such as silicone rubber) may be affixed from one end to the other end of fastening plate 71 so as to fill a space 97 formed between hooked portion 81 and fastening plate 71. When using such a waterproof packing member, rainwater infiltration from a gap between lid 66a and lid 66b can be prevented even in a case where rainwater hits the ground, splashes upward, and is blown up from the bottom of enclosure 50 during a rainstorm. Further, with outer case 65 closed with lids 66a and 66b, a waterproof packing member may be affixed on rear face portions of lids 66a and 66b facing a vertically extending end face 5b of outer peripheral portion 5 shown in FIG. 9. When using such a waterproof packing member, rainwater infiltration from a gap between lids 66a and 66b and outer peripheral portion 5 can be prevented even in a case where rainwater hits a building, splashes and is blown in from behind the both sides of enclosure 50 during a rainstorm.

According to enclosure 50 for the power conditioner for a photovoltaic power generation system formed as described above, since enclosure 50 includes lid 66b closing only maintenance portion 62, maintenance of the power conditioner can be performed by removing lid 66b. This can prevent a worker from accidentally touching or damaging power converter 54 while working. In addition, this can prevent a foreign material such as dust from entering the inside of enclosure 50. Further, since screw 92 is covered with lid 66b, appearance seen from the front side of enclosure 50 can be improved. Furthermore, since lid 66b has inclined face 94, rainwater falling down the surface of lid 66a can be prevented from infiltrating from a gap between edge 95 of lid 66a and edge 96 of lid 66b to the inside of enclosure 50.

Third Embodiment

Figure 13:
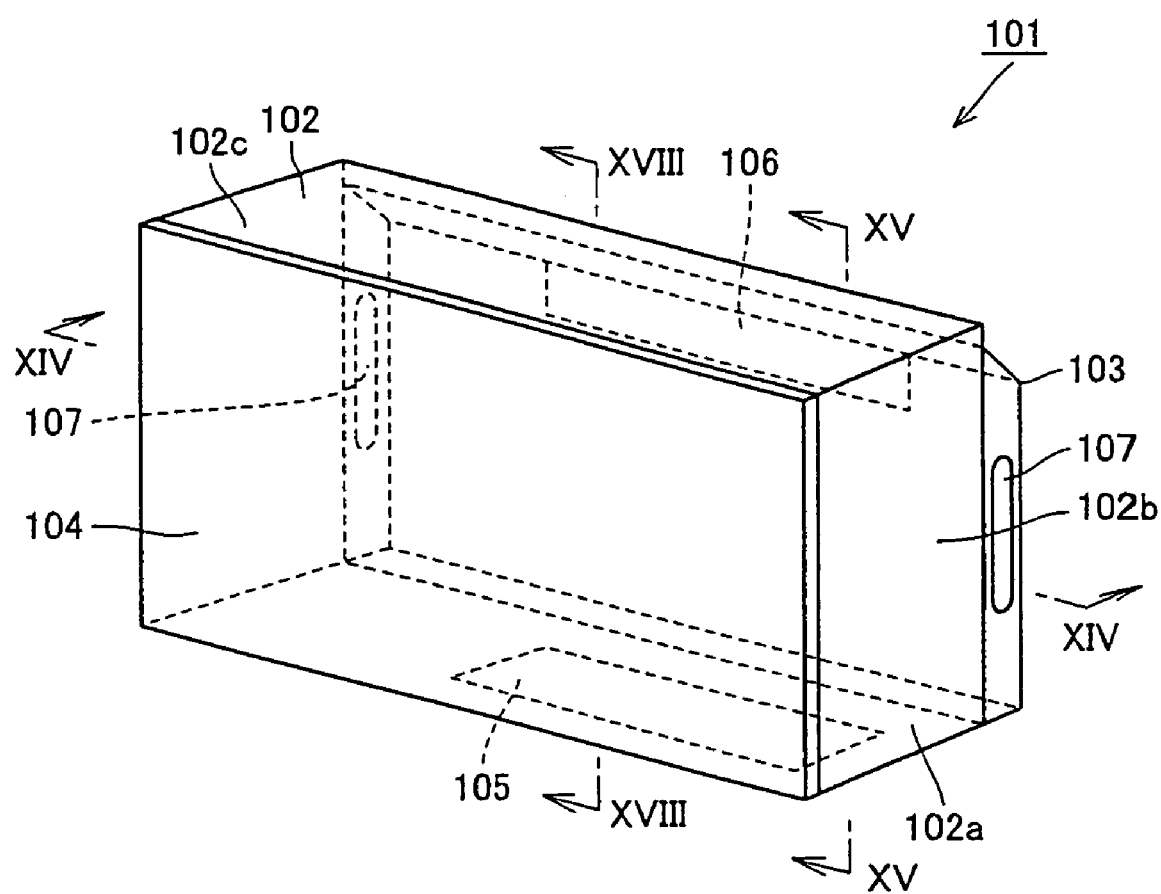
FIG. 13 is a perspective view seen from the front side showing a structure of an outdoor-installed power conditioner in a third embodiment of the present invention.

In the following, an outdoor-installed power conditioner in a third embodiment will be described with reference to the drawings. FIG. 13 is a perspective view seen from the front side showing a structure of an outdoor-installed power conditioner in the present embodiment.

Referring to FIG. 13, an outdoor-installed power conditioner 101 includes an outer case 102 constituting an enclosure and a lid 104 covering an opening provided on the front side of outer case 102. An exhaust channel forming member 103 is connected to the enclosure, and outdoor-installed power conditioner 101 is installed outdoors by mounting exhaust channel forming member 103 on an outer wall of a building. An intake vent 105 is provided in a bottom face 102a of outer case 102, and a first exhaust vent 106 is provided in a rear face 102b of outer case 102. Intake vent 105 is formed with rectangular holes arranged in a plurality of rows. Exhaust channel forming member 103 is provided on rear face 102b of outer case 102 so as to internally communicate with the first exhaust vent 106, and a second exhaust vent 107 in the shape of a slit extending vertically is provided in its each side face.

Figure 14:
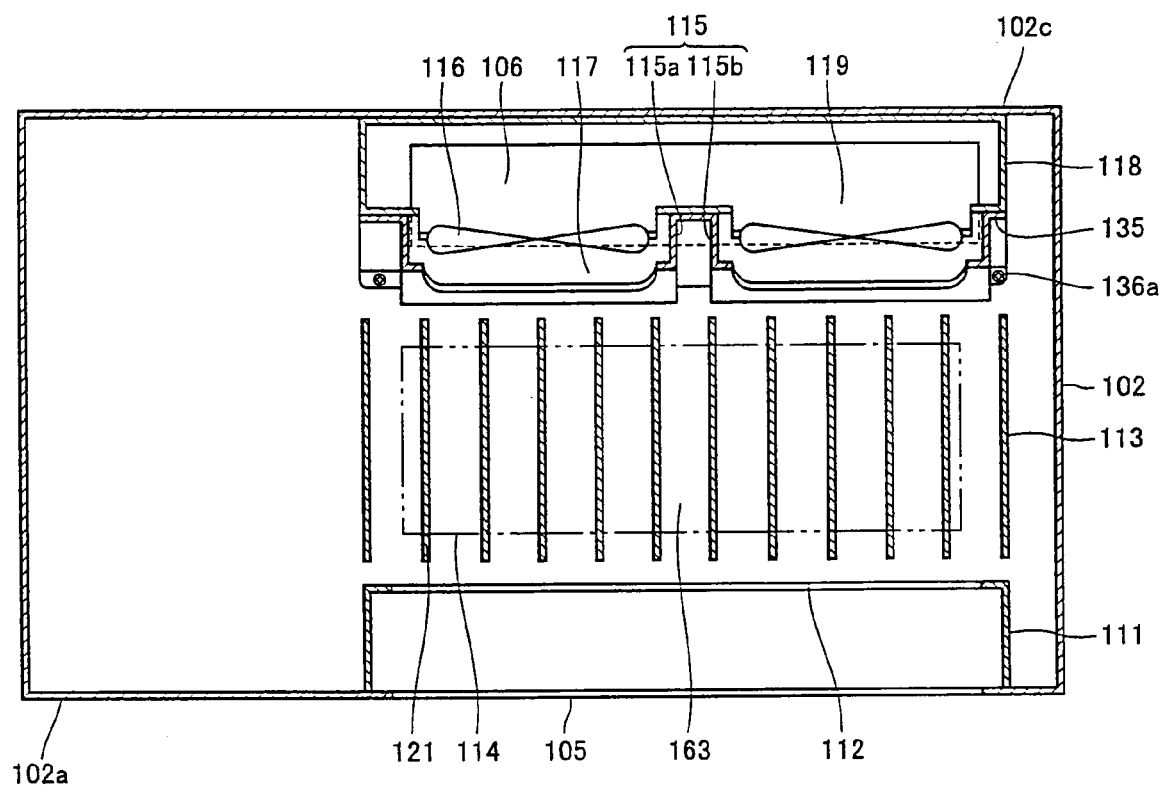
FIG. 14 is a cross-sectional view along the line XIV—XIV in FIG. 13.

FIG. 14 is a cross-sectional view along the line XIV—XIV in FIG. 13. Referring to FIG. 14, on the inside of bottom face 102a of outer case 102, a waterproof cover 111 is provided so as to cover intake vent 105. Waterproof cover 111 has an opening 112 in its top face. On rear face 102b of outer case 102, a heat sink 113 is provided so as to be located above waterproof cover 111. The inside of heat sink 113 is divided into a plurality of chambers by a plurality of blade portions extending vertically. On the front face of heat sink 113, there is provided a power converter 114 converting DC power output from a solar battery or the like into AC power.

A fan supporting portion 118 is provided along a top face 102c of outer case 102, and a plurality of apertures 119 are formed in its bottom face. It is to be noted that the bottom face of fan supporting portion 118 is inclined so as to become lower in level toward rear face 102b of outer case 102. The inside of fan supporting portion 118 communicates with the first exhaust vent 106 provided in rear face 102b of outer case 102. On the inclined bottom face of fan supporting portion 118 facing heat sink 113, there are provided a pair of fans 115a and 115b, each of which faces aperture 119 formed in fan supporting portion 118. An aperture 117 is formed in a bottom face of fan 115. A rotary blade 116 is provided within fan 115, and rotary blade 116 is connected to a motor (not shown) within fan 115. It is to be noted that the first exhaust vent 106 is provided as extending from a central portion to a right end portion in FIG. 14, and it is not provided at a portion adjacent to a left end. Although such a structure is employed in the present embodiment, if heat sink 113 is provided so as to extend from the right end portion to the left end portion of outer case 102, another fan 115 may be added and the first exhaust vent 106 may be provided so as to extend to the left end portion.

Figure 15:
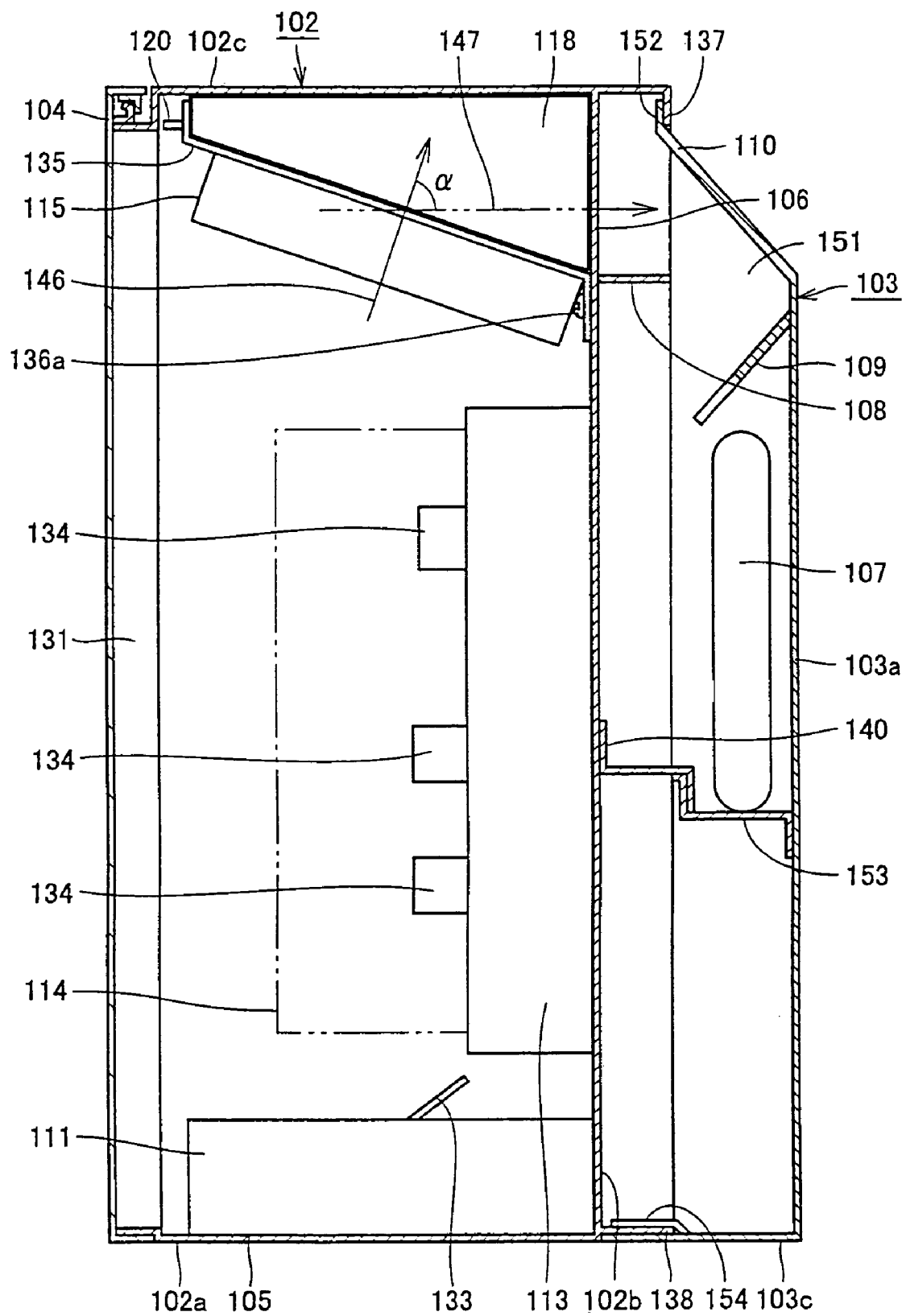
FIG. 15 is a cross-sectional view along the line XV—XV in FIG. 13.

FIG. 15 is a cross-sectional view along the line XV—XV in FIG. 13. Referring to FIG. 15, an intake guide 133 extending toward a lower part of heat sink 113 is formed on the top face of waterproof cover 111. A power element 134, which is the most heat generating element in power converter 114, is provided so as to contact a surface of a heat sink 113.

The bottom face of fan supporting portion 118 is inclined, and the bottom face is in contact with a fan connecting portion 135 of fan 115. Fan 115 is fixed by inserting a convex portion 120 at the forward portion of the bottom face of fan supporting portion 118 into a slit portion (not shown) at fan connecting portion 135 and fastening a lower end of each side of fan connecting portion 135 to rear face 102b of outer case 102 by means of a screw 136a. Screw 136a is provided such that its screw head is directed to an opening 131 of outer case 102. Therefore, when performing maintenance of fan 115, fan 115 can directly be removed from outer case 102 by removing lid 104 from outer case 102 and unfastening screw 136a from the side of opening 131 of outer case 102. Further, when attaching a new fan to outer case 102, the above-mentioned procedure may be performed in the reverse order.

Rotary blade 116 within fan 115 is provided such that a rotation axis of rotary blade 116 intersects the bottom face of fan supporting portion 118 at right angles. As rotary blade 116 within fan 115 is driven, air is blown in a direction indicated by an arrow 146. The direction of arrow 146 corresponds to the direction of the rotation axis of rotary blade 116 in fan 115. The air introduced into fan supporting portion 118 by fan 115 flows in a direction indicated by an arrow 147, and is exhausted from the first exhaust vent 106 to the outside of outer case 102. On this occasion, the bottom face of fan supporting portion 118 is inclined such that an angle $\alpha$ formed by the direction indicated by arrow 146 and the direction indicated by arrow 147 becomes 70°. Thus, the air within outer case 102 can efficiently be blown to exhaust vent 106.

It is to be noted that, in the present embodiment, angle $\alpha$ formed by the direction indicated by arrow 146 and the direction indicated by arrow 147 is set at 70°. As long as angle $\alpha$ is smaller than a right angle, that is, an acute angle, the air within outer case 102 can be blown to exhaust vent 106 more efficiently than in the case where angle $\alpha$ is 90°. With this structure, the head of arrow 146 indicating the direction of the rotation axis of rotary blade 116, that is, the direction of the air blown by rotary blade 116, is inclined toward the first exhaust vent 106. This allows the air exhausted from fan 115 to flow toward the first exhaust vent 106 easily.

Rear face 102b of outer case 102 is provided with an upper hook portion 137, a middle hook portion 140, and a lower screw-fastened portion 138. At positions corresponding to these portions on exhaust channel forming member 103, there are provided an upper engaged portion 152, a middle engaged portion 153, and a lower engaged portion 154, respectively. Outer case 102 is fixed to exhaust channel forming member 103 by locking these portions and fastening them with screws. Thus, an exhaust channel 151 surrounded by rear face 102b of outer case 102 and an inner face of exhaust channel forming member 103 is formed. Further, by fixing outer case 102 to exhaust channel forming member 103 in this manner, outdoor-installed power conditioner 101 can be prevented from being detached from exhaust channel forming member 103 due to a rainstorm or the like.

A first water stop member 108 is provided along a lower end portion of the first exhaust vent 106 formed in the upper part of rear face 102b of outer case 102. The first water stop member 108 lies so as to extend from one end to the other end of the first exhaust vent 106. Further, the first water stop member 108 is provided so as to form a right angle with an opening plane of the first exhaust vent 106, in other words, with rear face 102b of outer case 102, and to project toward the inside of exhaust channel 151.

Figure 16:
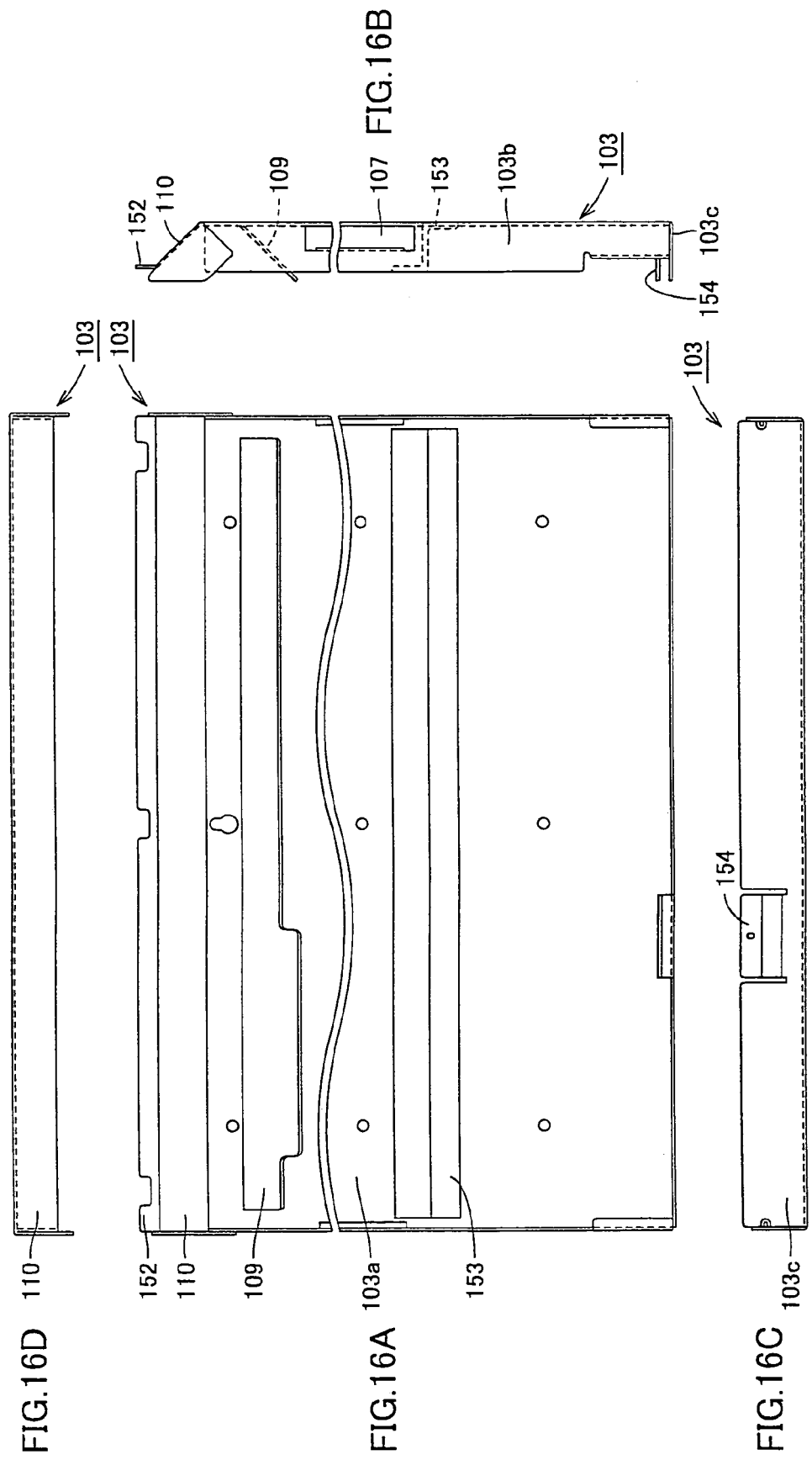
FIGS. 16A to 16D show a structure of an exhaust channel forming member.

FIGS. 16A to 16D show a structure of the exhaust channel forming member. FIG. 16A is a front view, FIG. 16B is a side view, FIG. 16C is a bottom view, and FIG. 16D is a top view. An inclined top panel 110 forming a top face of exhaust channel forming member 103 is formed by bending an upper end portion of a rear panel 103a of exhaust channel forming member 103 so as to be inclined at an obtuse angle with respect to rear panel 103. Thus, when exhaust channel forming member 103 is attached to outer case 102, the surface of inclined top panel 110 forming its top face is inclined so as to become lower in level with distance from outer case 102. Further, upper engaged portion 152 is provided continuously from an upper end portion of inclined top panel 110.

A side panel 103b and a bottom panel 103c of exhaust channel forming member 103 are formed by bending end portions of rear panel 103a of exhaust channel forming member 103 at right angles. A second exhaust vent 107 is provided in each side panel 103b of exhaust channel forming member 103. On rear panel 103a of exhaust channel forming member 103, a second water stop member 109 is provided so as to be located upper than the second exhaust vent 107. The second water stop member 109 projects toward exhaust channel 151 obliquely downwardly, and is provided in a direction perpendicular to inclined top panel 110. Further, the second water stop member 109 has different projecting lengths depending on its position. A leftward part of the second water stop member 109 in FIG. 16A substantially corresponding to a position in which the first exhaust vent 106 is not provided is formed so as to project longer than the other part. In exhaust channel forming member 103, middle engaged portion 153 is provided on rear plate 103a, and lower engaged portion 154 is provided on bottom plate 103c.

Figure 17:
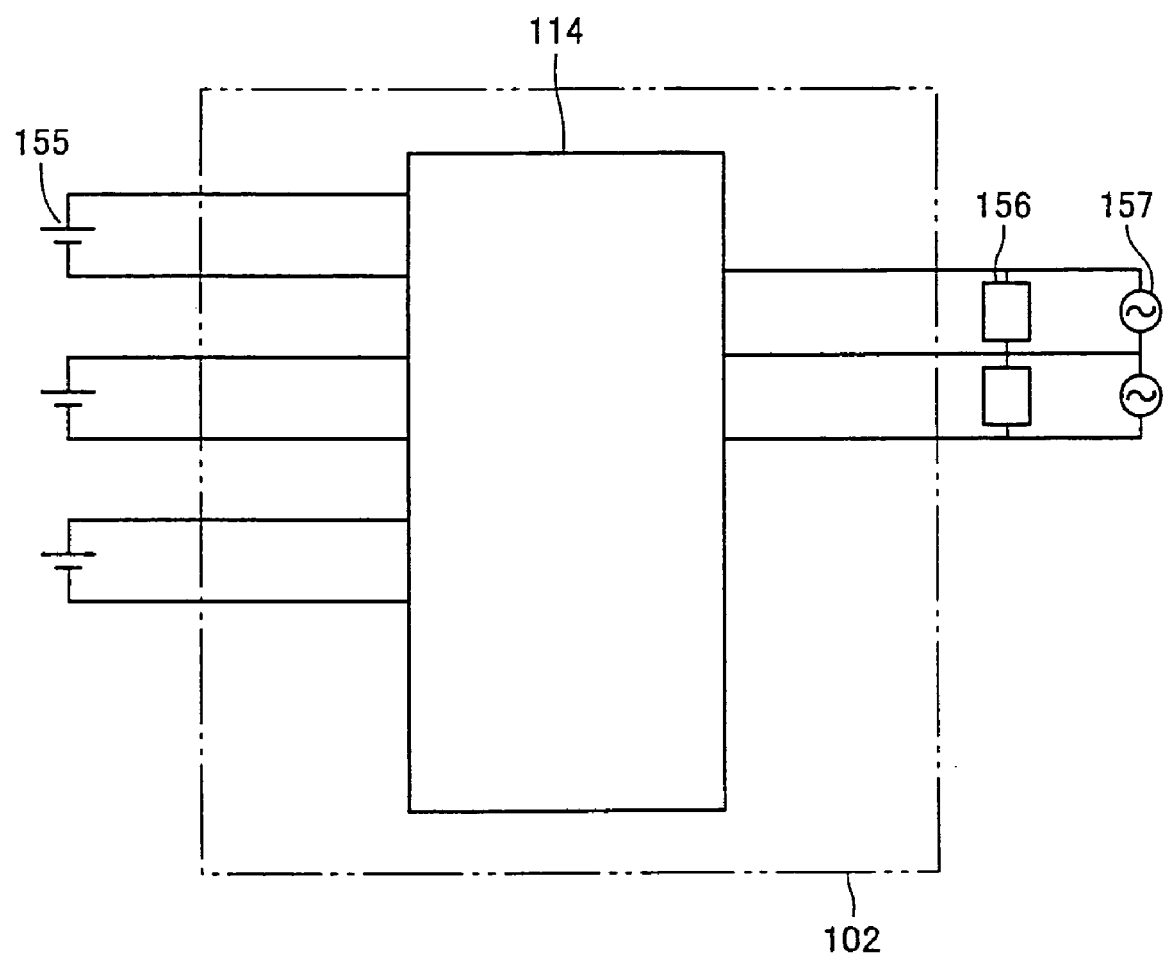
FIG. 17 is a circuit diagram of a system using an outdoor-installed power conditioner.

FIG. 17 is a circuit diagram of a system using the outdoor-installed power conditioner in the present embodiment. With reference to FIG. 17, the system using the outdoor-installed power conditioner will be described briefly.

Referring to FIG. 17, power converter 114 is provided within outer case 102. Power converter 114 includes a main circuit component such as a switching element, and a control circuit component such as a microcomputer. Interconnections from an external DC power supply 155, a commercial power system 157 and an in-home electric load 156 are connected to power converter 114.

In the system using the outdoor-installed power conditioner formed as described above, DC power output from DC power supply 155 can be converted via power converter 114 into AC power at a frequency of 50/60 Hz, as in the first embodiment. Then, the AC power can be supplied to commercial power system 157 or in-home electric load 156.

Figure 18:
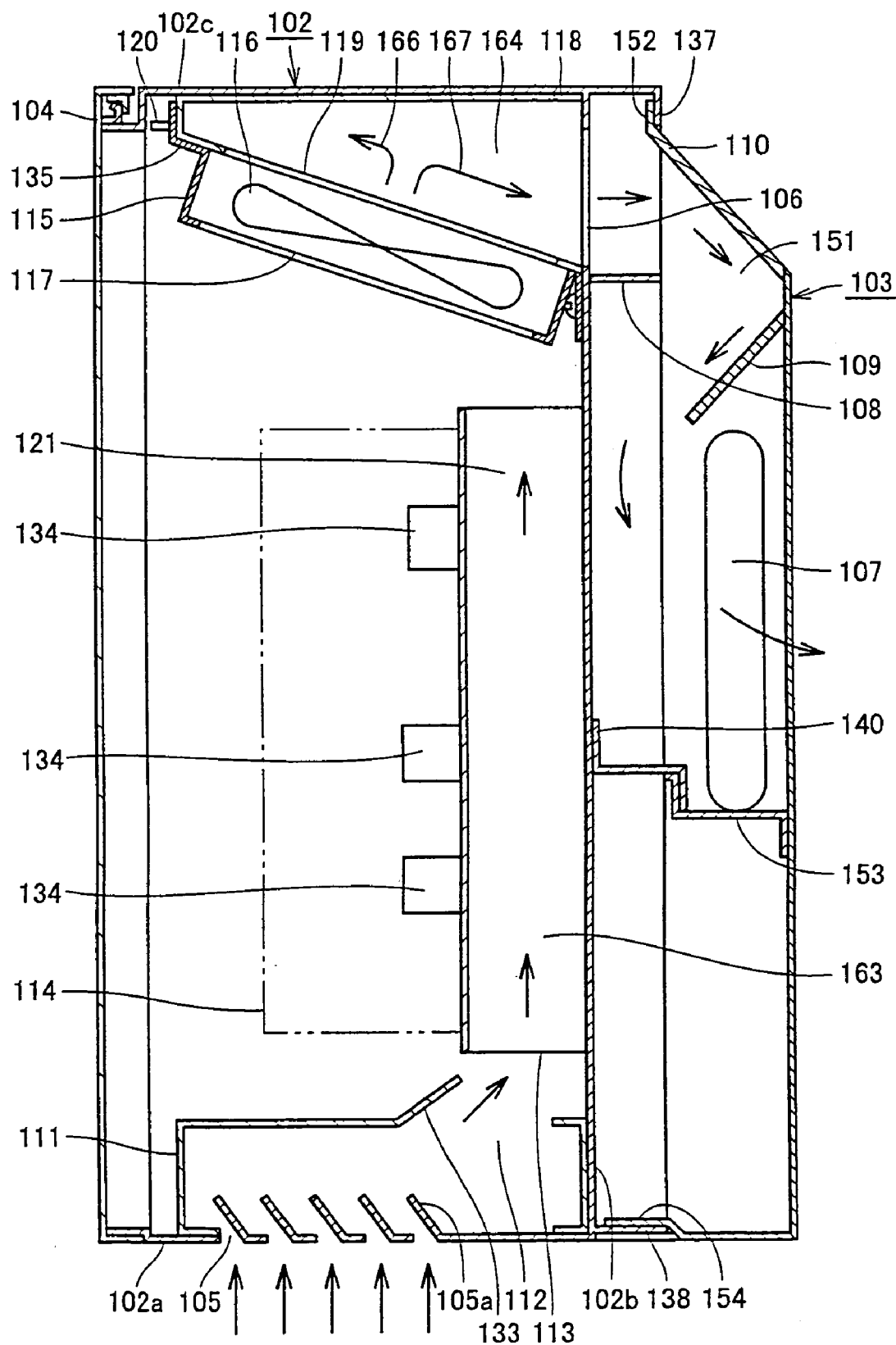
FIG. 18 is a cross-sectional view along the line XVIII—XVIII in FIG. 13.

FIG. 18 is a cross-sectional view along the line XVIII—XVIII in FIG. 13. With reference to FIG. 18, a cooling structure of outdoor-installed power conditioner 101 will be described.

Waterproof cover 111 has a cross section shaped in a rectangular box, and opening 112 is formed so as to be located in the proximity of the lower part of heat sink 113. An inclined plate 105a is formed at intake vent 105 so as to be directed toward the inside of outer case 102, thereby preventing rainwater infiltration from intake vent 105 to the inside of outer case 102 during a rainstorm or the like.

Outside cool air is taken in from intake vent 105 to the inside of outer case 102 by driving rotary blade 116 within fan 115. The air taken in passes through a space formed within waterproof cover 111 and is exhausted from opening 112. On this occasion, the air is guided by intake guide 133 formed on waterproof cover 111, and moves to a space 163 formed within heat sink 113.

Space 163 is divided into a plurality of chambers by vertically extending blade portions 121 (see FIG. 14) formed within heat sink 113, and the air passes through each chamber of space 163. The heat generated at power element 134 has been conducted to blade portions 121 of heat sink 113. The heat of blade portions 121 is removed as the cool air passes in contact with blade portions 121 within heat sink 113. As a result, power converter 114 is cooled down.

The air heated by heat exchange with blade portions 121 when passing through space 163 within heat sink 113 is exhausted upward from heat sink 113. The air is taken in by fan 115, and passes through aperture 117 of fan 115 and aperture 119 of fan supporting portion 118. Then, after being guided to a space 164 within fan supporting portion 118, the air is exhausted from the first exhaust vent 106. On this occasion, the air passing though fan 115 moves along an axial direction of rotary blade 116. Since fan 115 is provided so as to be inclined as described above, when the angle α is 70°, about 60 percent of the air striking against the upper face of fan supporting portion 118 flows in a direction toward the first exhaust vent 106 indicated by an arrow 167, and the remaining about 40 percent flows in a direction opposite to the first exhaust vent 106 indicated by an arrow 166 and circulates within fan supporting portion 118. Thus, the air in outer case 102 can efficiently be blown to the first exhaust vent 106.

The air exhausted from the first exhaust vent 106 moves along the backside of inclined top panel 110 and is guided to a lower part of exhaust channel 151, as indicated by arrows. Then, through exhaust channel 151 bent by the projecting first water stop member 108 and second water stop member 109, the air is exhausted from the second exhaust vent 107 out of outdoor-installed power conditioner 101. Since the second water stop member 109 is provided in the direction perpendicular to the backside of inclined top panel 110, it allows the air guided by inclined top panel 110 to flow smoothly. In this manner, inclined top panel 110, the first water stop member 108 and the second water stop member 109 serve as an exhaust guide guiding the air in exhaust channel 151.

Since exhaust channel 151 is formed surrounded by exhaust channel forming member 103 and rear face 102b of outer case 102, exhaust channel 151 can be secured reliably without being effected by failure in installing outdoor-installed power conditioner 101 or an external factor such as dust accumulation after the installation. In this manner, an increase in the temperature of power converter 114 can be suppressed by efficiently circulating air for cooling within outdoor-installed power conditioner 101 and performing forced air cooling of power converter 114.

Figure 19:
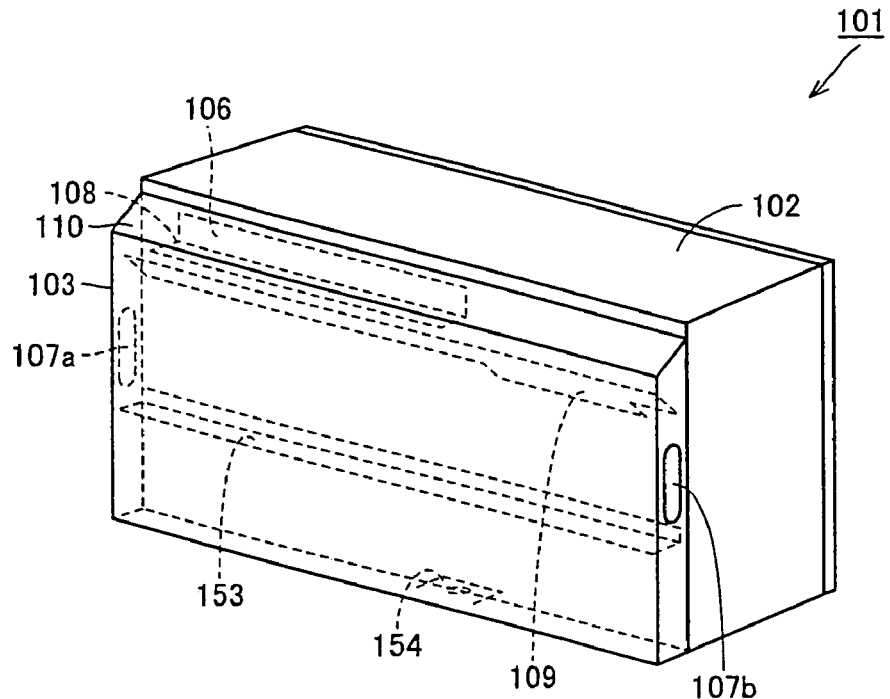
FIG. 19 is a perspective view seen from the rear side showing the structure of the outdoor-installed power conditioner in the third embodiment of the present invention.

FIG. 19 is a perspective view seen from the rear side showing the structure of the outdoor-installed power conditioner. Referring to FIG. 19, outdoor-installed power conditioner 101 is installed outdoors by mounting exhaust channel forming member 103 on the outer wall of the building. In this manner, exhaust channel forming member 103 serves as a mounting plate. The first exhaust vent 106 provided in outer case 102 is covered with exhaust channel forming member 103. This structure prevents rainwater from infiltrating from the first exhaust vent 106 to the inside of outer case 102.

Further, the top face of exhaust channel forming member 103 is inclined so as to become lower in level with distance from outer case 102, in other words, as it approaches the outer wall on which the outdoor-installed power conditioner is mounted. Even in a downpour or the like, rainwater runs down to the outer wall side without accumulating on the top face of inclined top panel 110. This structure can prevent rainwater from infiltrating through a gap between upper hook portion 137 and upper engaged portion 152 shown in FIGS. 14 and 18 to the inside of outdoor-installed power conditioner 101.

Referring to FIG. 19, the shortest exhaust route between the second exhaust vent 107*a* located in the left side face and the first exhaust vent 106 is formed between the second exhaust vent 107*a* and the left side end portion of the first exhaust vent 106. Similarly, the shortest exhaust route between the second exhaust vent 107*b* located in the right side face and the first exhaust vent 106 is formed between the second exhaust vent 107*b* and the right side end portion of the first exhaust vent 106. Here, the second exhaust vent 107 is located at a position lower than the first exhaust vent 106.

Assuming a rainstorm with stormy gusts of wind, rainwater infiltrating from the second exhaust vent 107 located at a lower position into exhaust channel 151 may infiltrate from the first exhaust vent 106 to the inside of outer case 102. On this occasion, since the exhaust route from the second exhaust vent 107*b* on the right side to the first exhaust vent 106 is longer than the exhaust route from the second exhaust vent 107*a* on the left side to the first exhaust vent 106 as seen in FIG. 19, the infiltration angle of rainwater becomes gentler. Further, the first water stop member 108 is not provided at the right portion in FIG. 19 in which the first exhaust vent 106 is not formed. These factors may increase the possibility of rainwater infiltration from the second exhaust vent 107*b* in the right side face.

In the present embodiment, to maintain waterproofing ability even in such a condition, the second water stop member 109 located between the second exhaust vent 107*b* in the right side face and the first exhaust vent 106 is formed to project longer so as to block a linear rainwater infiltration route formed therebetween. Thus, even if you look inside from either of the second exhaust vents 107, the first exhaust vent 106 cannot be seen.

With this structure, even if rainwater hits the ground, splashes upward and infiltrates from the second exhaust vent 107 to the inside, for example, rainwater infiltration into the first exhaust vent 106 can be prevented by means of the first water stop member 108 and the second water stop member 109. At the same time, the length of the second water stop member 109 is set as necessary, minimizing an adverse effect on exhaust efficiency in exhaust channel 151 by the second water stop member 109.

Fourth Embodiment

Figure 20:
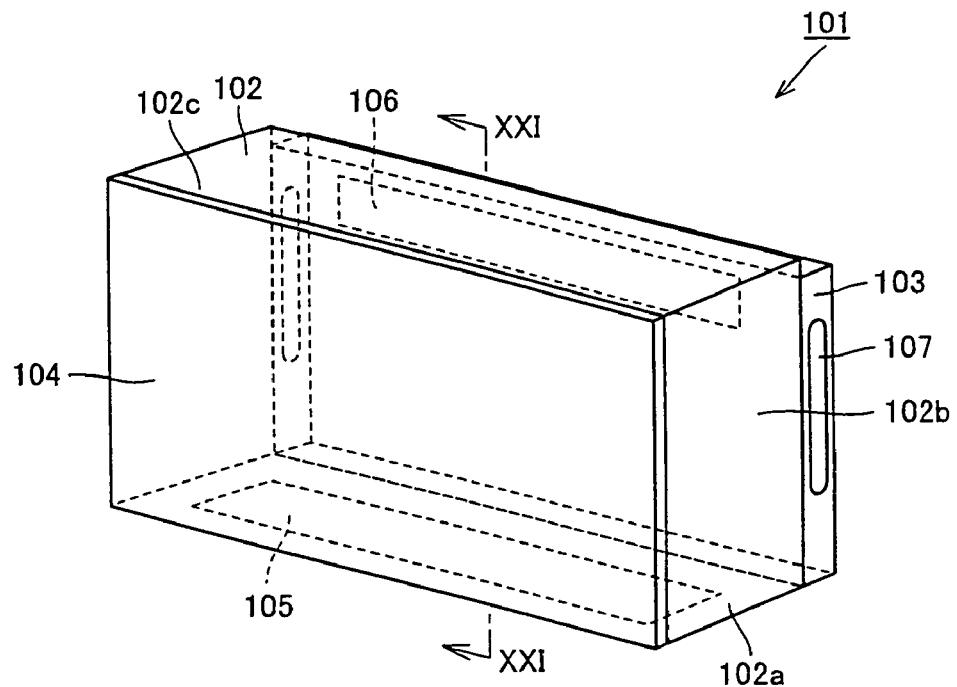
FIG. 20 is a perspective view seen from the front side showing a structure of an outdoor-installed power conditioner in a fourth embodiment of the present invention.
Figure 21:
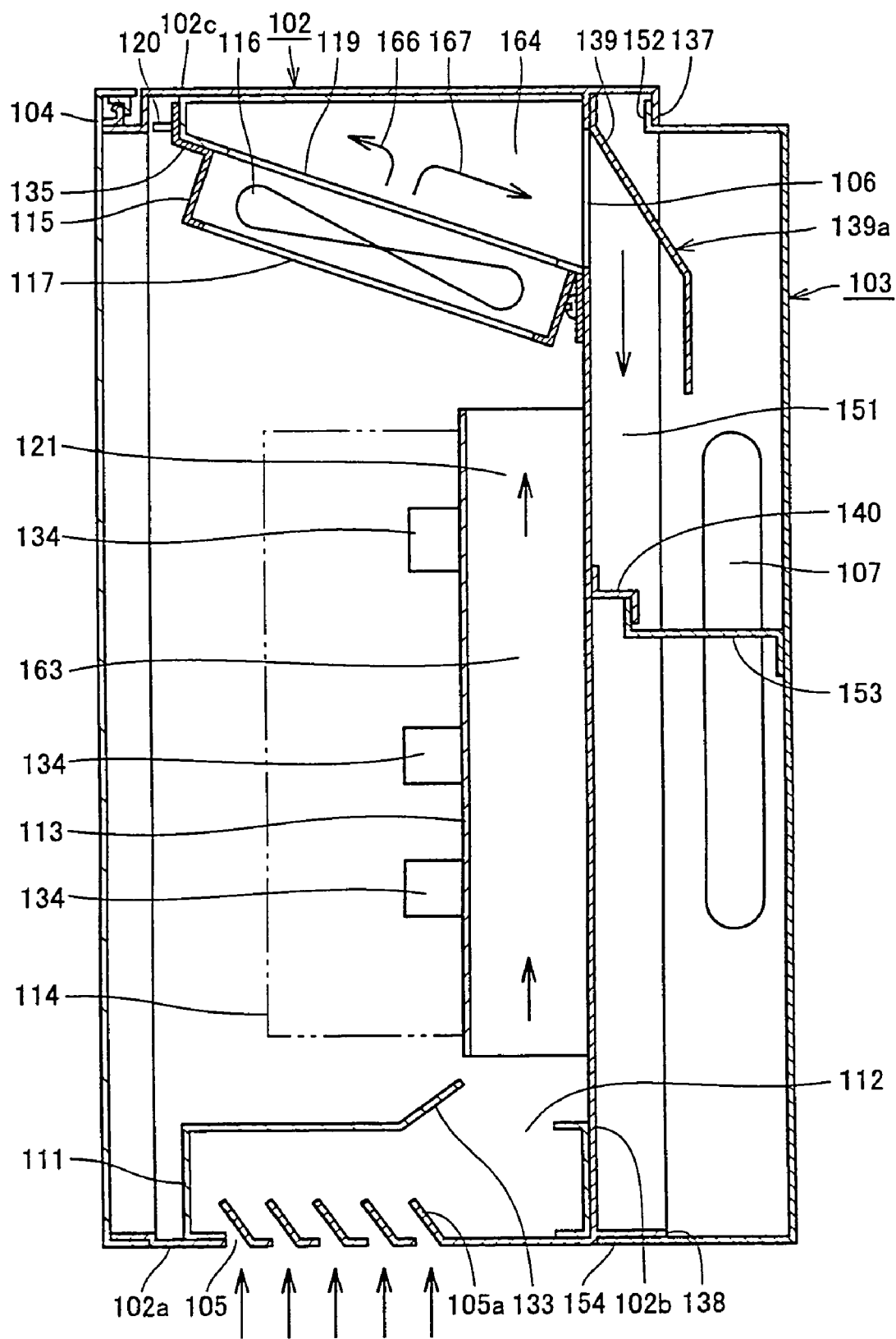
FIG. 21 is a cross-sectional view along the line XXI—XXI in FIG. 20.
Figure 22:
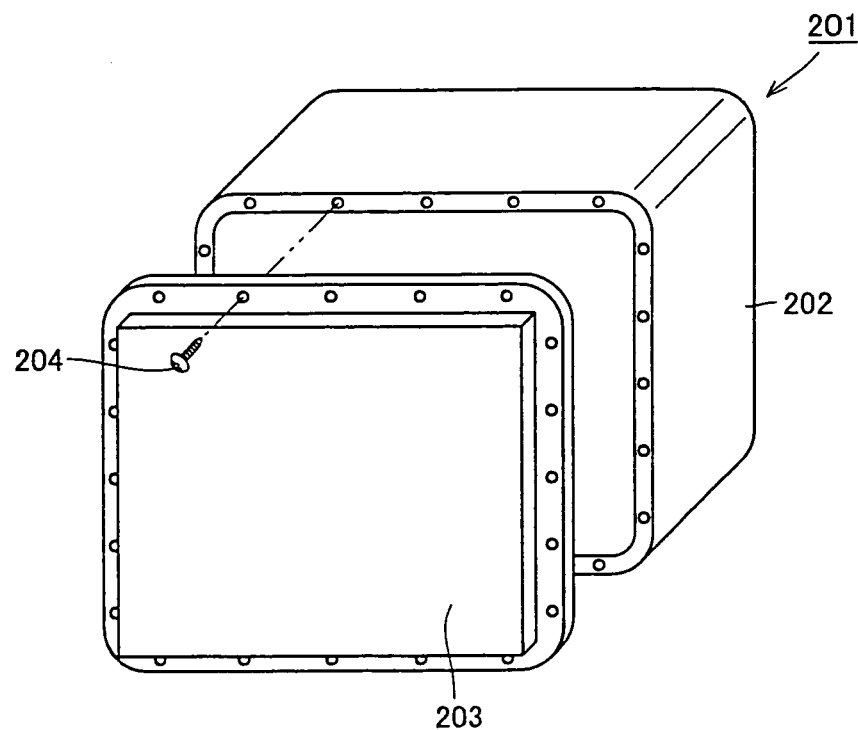
FIG. 22 is a perspective view showing an enclosure for a conventional outdoor-installed power conditioner.
Figure 23:
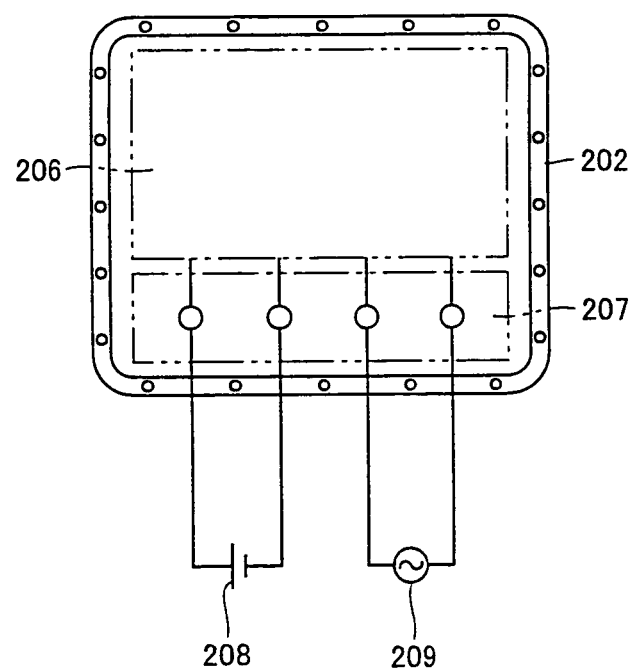
FIG. 23 is a front view showing the conventional outdoor-installed power conditioner.
Figure 24:
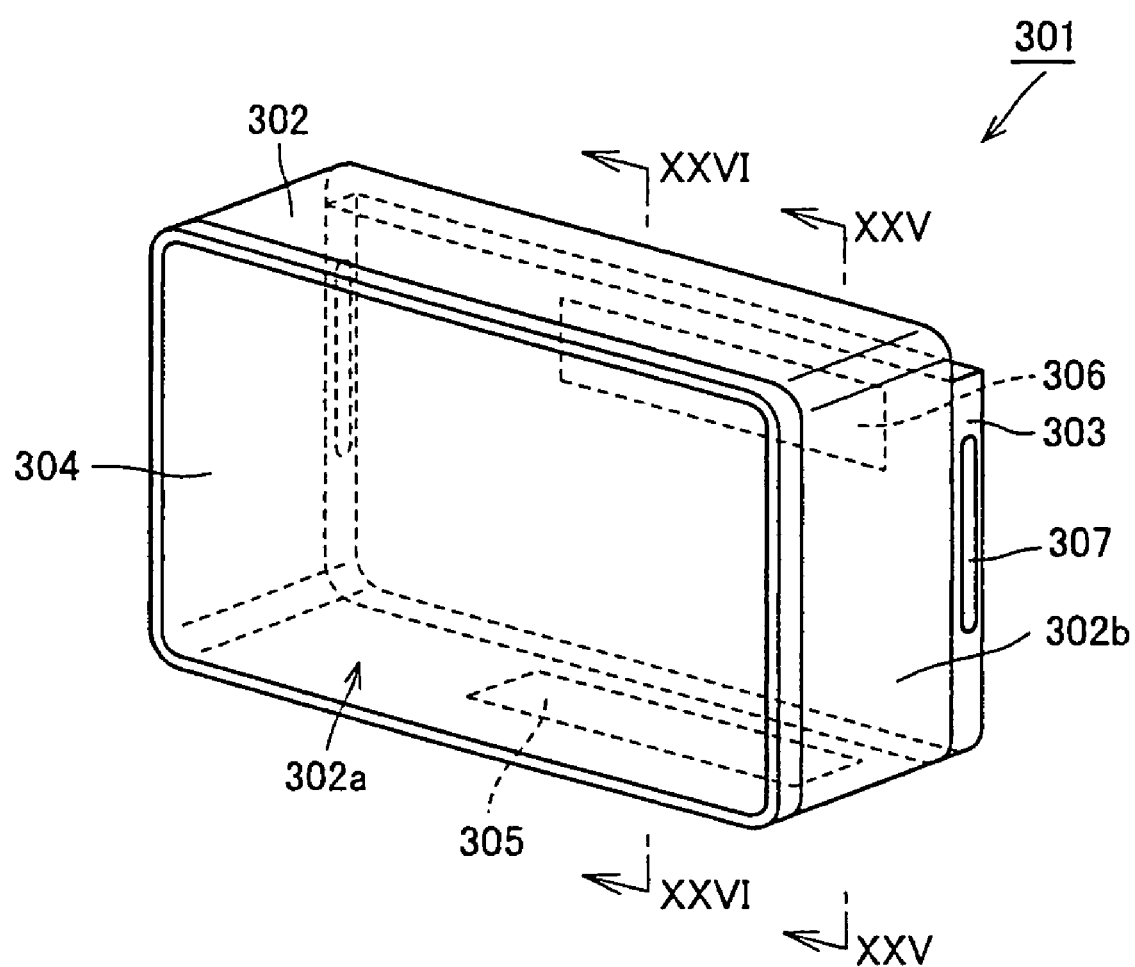
FIG. 24 is a perspective view showing an appearance of the conventional outdoor-installed power conditioner.
Figure 25:
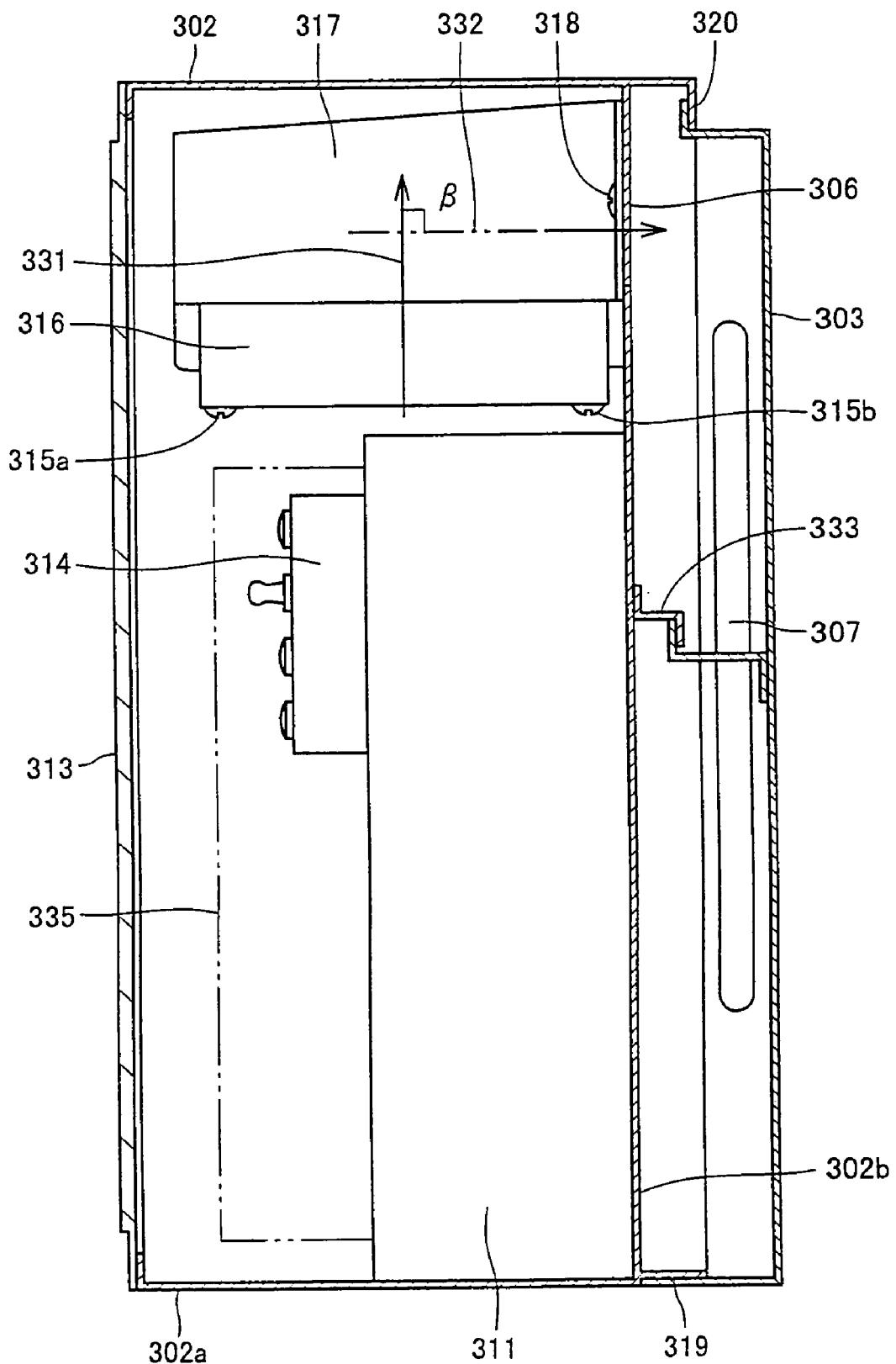
FIG. 25 is a cross-sectional view along the line XXV—XXV in FIG. 24.
Figure 26:
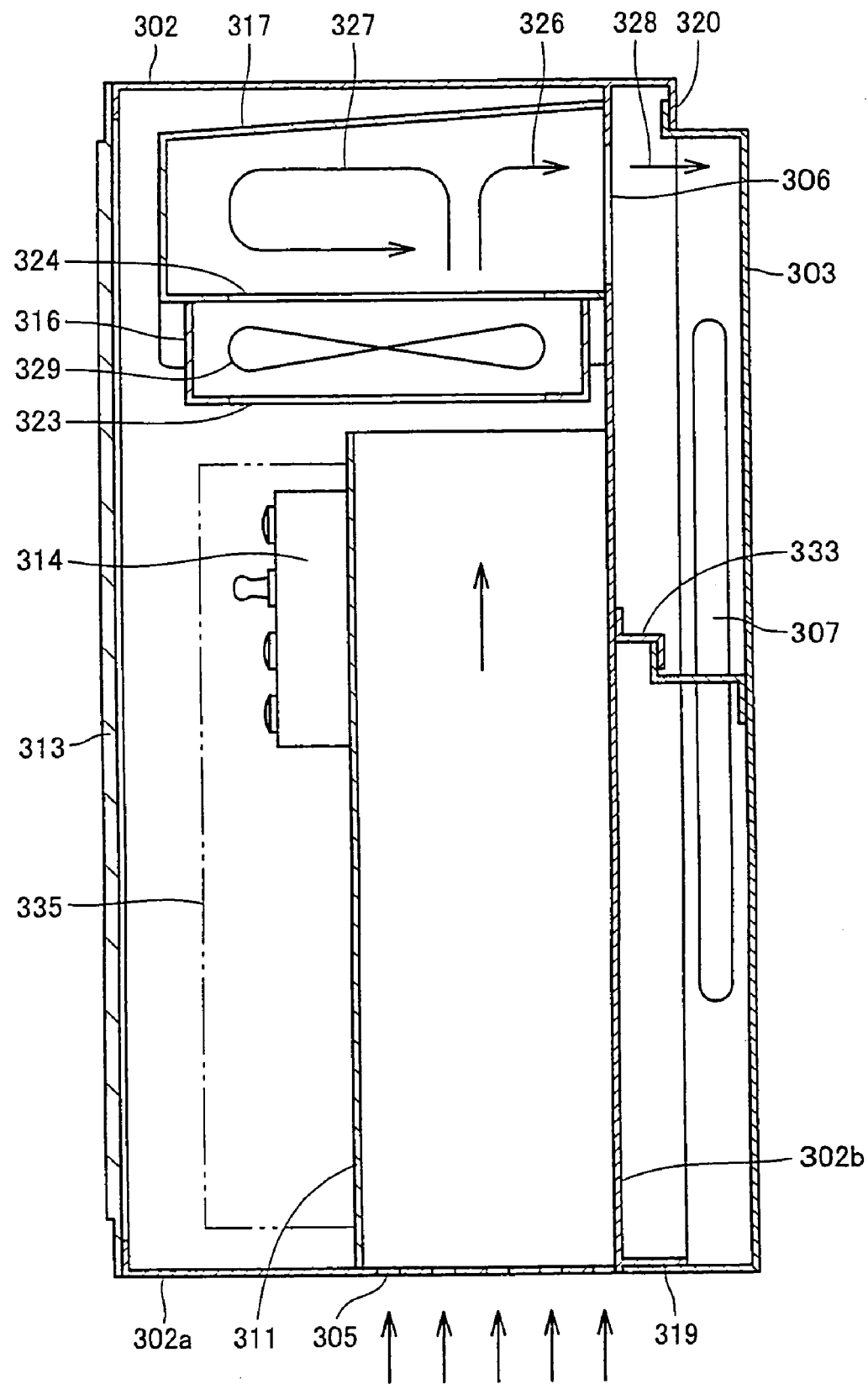
FIG. 26 is a cross-sectional view along the line XXVI—XXVI in FIG. 24.

Next, a fourth embodiment of an outdoor-installed power conditioner will be described. FIG. 20 is a perspective view seen from the front side showing a structure of an outdoor-installed power conditioner in the present embodiment, and FIG. 21 is a cross-sectional view along the line XXI—XXI in FIG. 20. In these drawings, members corresponding to those in the third embodiment have same reference numerals.

In the fourth embodiment, the top face of exhaust channel forming member 103 is formed horizontally. Further, an exhaust guide 139*a* is attached on rear face 102*b* of outer case 102 to guide the air exhausted from the first exhaust vent 106 to the lower part of exhaust channel 151 smoothly.

Also in the present embodiment, fan 115 is inclined with respect to exhaust vent 106 such that the direction indicated by arrow 146 shown in FIG. 15 as the direction in which the air blown out from fan 115 flows and the direction indicated by arrow 147 shown in FIG. 15 as the direction in which the air exhausted from exhaust vent 106 flows form an acute angle.

According to a cooling structure of outdoor-installed power conditioner 101 formed as described above, since the direction indicated by arrow 146 as the direction in which the air blown out from fan 115 flows and the direction indicated by arrow 147 as the direction in which the air exhausted from exhaust vent 106 flows form an acute angle, the air blown out from fan 115 is efficiently exhausted from exhaust vent 106 out of outer case 102. In addition, by means of intake guide 133 provided on waterproof cover 111, outside cool air is efficiently guided from intake vent 105 into heat sink 113. Further, by means of exhaust guide 139 provided within a space formed by exhaust channel forming member 103, the air exhausted from the first exhaust vent 106 is efficiently guided to the second exhaust vent 107. For these reasons, an increase in the temperature of power converter 114 can be suppressed by efficiently circulating air for cooling within outdoor-installed power conditioner 101 and performing forced air cooling of power converter 114.

As has been described above, both in the third and the fourth embodiments, fan 115 is inclined with respect to the first exhaust vent 106 such that the direction in which the air blown out from fan 115 flows and the direction in which the air exhausted from the first exhaust vent 106 flows form an acute angle. A conventional outdoor-installed power conditioner has a problem that the air taken in by the fan is not efficiently exhausted out of the outer case because the direction in which the air blown out by the fan flows is relatively perpendicular to the direction in which the air exhausted from the exhaust vent flows. On the other hand, in the third and the fourth embodiments, the structure as described above can solve the conventional problem and allows the air exhausted from fan 115 to be exhausted from the first exhaust vent 106 efficiently. Thus, cooling efficiency within outdoor-installed power conditioner 101 is improved, as compared with the conventional outdoor-installed power conditioner.

Further, in the third and the fourth embodiments, waterproof cover 111 is provided so as to cover intake vent 105, preventing rainwater from infiltrating from intake vent 105 to a space provided with electronics such as power converter 114. Particularly, even in a condition that rainwater hits the ground, splashes upward and is blown up from bottom face 102*a* of outer case 102 during a rainstorm or the like, rainwater infiltration can effectively be prevented. Thus, electronics provided within outer case 102 can be protected from rainwater more reliably.

Now, a comparison of the third embodiment with the fourth embodiment indicates that the third embodiment has more excellent features than the fourth embodiment as described below. In the fourth embodiment, since the top face of exhaust channel forming member 103 is formed horizontally, rainwater may accumulate thereon when a rainstorm occurs. In that case, the rainwater may infiltrate into exhaust channel 151 from a gap between upper hook portion 137 and upper engaged portion 152. The infiltrating rainwater may further be fanned by wind from the second exhaust vent 107 and infiltrate via the first exhaust vent 106 into outer case 102.

On the other hand, in the third embodiment, the top face of exhaust channel forming member 103 is inclined so as to become lower in level with distance from outer case 102. Thus, rainwater does not accumulate on inclined top plate 110 forming the top face of exhaust channel forming member 103, and runs down to the side opposite to outer case 102. This structure can prevent rainwater from infiltrating to the inside from a gap between upper hook portion 137 and upper engaged portion 152, that is, between the connecting portions of outer case 102 and exhaust channel forming member 103.

Further, in the fourth embodiment, exhaust guide 139a is provided in front of the first exhaust vent 106. On the other hand, in the third embodiment, since inclined top plate 110 forming the top face of exhaust channel forming member 103 is inclined as described above, the backside of inclined top plate 110 guides the air exhausted from the first exhaust vent 106 to the lower part of exhaust channel 151. Thus, the number of members required can be reduced, compared with the fourth embodiment.

INDUSTRIAL APPLICABILITY

As has been described above, the outdoor-installed power conditioner in accordance with the present invention can be used with being mounted on an outer wall of a building or the like. Since it has an excellent waterproof structure, it is suitable especially when being installed at a location where rain or the like falls thereon.

The invention claimed is:

1. An outdoor-installed power conditioner, comprising an enclosure housing a power converter therein,
wherein said enclosure includes an outer case having a side face provided with an opening for housing the power converter and a lid for closing said opening, said outer case including a first projecting strip portion provided on a side close to a top face of said outer case and on an outer peripheral portion defining said opening, and extending to project outwardly from said outer case,
said lid including a second projecting strip portion provided at a position facing said first projecting strip portion, and
with said opening of said outer case closed with said lid, said first and second projecting strip portions making close contact with each other along a direction in which said first and second projecting strip portions extend.

2. The outdoor-installed power conditioner according to claim 1, wherein said outer peripheral portion is formed of a ribbed body, surrounding said opening and projecting from said side face provided with said opening.

3. The outdoor-installed power conditioner according to claim 1, wherein said first projecting strip portion extends from one end to the other end of said outer peripheral portion provided with said first projecting strip portion.

4. The outdoor-installed power conditioner according to claim 1, wherein said first or second projecting strip portion includes a portion guiding the other projecting strip portion when said opening of said outer case is closed with said lid.

5. The outdoor-installed power conditioner according to claim 1, wherein said lid further includes first fixing means provided in a face other than a face facing said opening to fix said lid to said outer case.

6. The outdoor-installed power conditioner according to claim 1, wherein said enclosure houses said power converter requiring no maintenance work and a maintenance portion requiring maintenance work, and said lid includes a first portion closing said power converter and a second portion closing said maintenance portion.

7. The outdoor-installed power conditioner according to claim 6, wherein second fixing means fixing said first portion to said outer case is covered with said second portion.

8. The outdoor-installed power conditioner according to claim 6, wherein said second portion is provided lower than said first portion, each of said first and second portions has an edge confronting each other, the edge of said second portion is bent toward inside of said enclosure to form an inclined face, and said inclined face is located on a line extending from the edge of said first portion.

9. The outdoor-installed power conditioner according to claim 1,
wherein said enclosure includes an intake vent and a first exhaust vent,
said enclosure is provided with a fan blowing air taken in from said intake vent to flow through said power converter to said first exhaust vent to cool down said power converter, and
said fan is inclined with respect to said first exhaust vent such that a direction in which the air blown out from said fan flows and a direction in which the air exhausted from said first exhaust vent flows form an acute angle.

10. The outdoor-installed power conditioner according to claim 9, further comprising an exhaust channel forming member communicating with said first exhaust vent and provided adjacent to said enclosure, wherein said exhaust channel forming member includes a second exhaust vent for exhausting the air exhausted from said first exhaust vent out of the outdoor-installed power conditioner.

11. The outdoor-installed power conditioner according to claim 10, further comprising an exhaust guide guiding the air from said first exhaust vent toward said second exhaust vent.

12. The outdoor-installed power conditioner according to claim 9, further comprising a waterproof member formed on inside of said enclosure to cover said intake vent, wherein said waterproof member includes an intake guide guiding the air from said intake vent toward said power converter.

13. The outdoor-installed power conditioner according to claim 9, wherein said fan is mounted to be directly attachable to and detachable from said enclosure.

14. The outdoor-installed power conditioner according to claim 1,
wherein said enclosure includes an intake vent and a first exhaust vent,
said enclosure is provided with a fan blowing air taken in from said intake vent to flow through said power converter to said first exhaust vent to cool down said power converter, and
an exhaust channel forming member is connected to said enclosure,
said exhaust channel forming member communicating with said first exhaust vent to form an exhaust channel therein, and including a second exhaust vent for exhausting the air within said exhaust channel outside, and
said exhaust channel forming member having a top face inclined so as to become lower in level with distance from said enclosure.

15. The outdoor-installed power conditioner according to claim 14, wherein said second exhaust vent is located lower than said first exhaust vent, and a first water stop member projecting toward said exhaust channel is provided along a lower end portion of said first exhaust vent.

16. The outdoor-installed power conditioner according to claim 15, wherein a second water stop member is provided to project toward a position lower than said first water stop member in said exhaust channel, and said second water stop member is provided on a face facing a face provided with said first water stop member.

17. The outdoor-installed power conditioner according to claim 16, wherein said second water stop member is inclined to form a substantially right angle with respect to the top face of said exhaust channel forming member.

18. The outdoor-installed power conditioner according to claim 16, wherein said second exhaust vent is located in each of a right side face and a left side face of said exhaust channel forming member, and a projecting length of said second water stop member located on one of an exhaust route formed between said second exhaust vent in the right side face and a right end of said first exhaust vent and an exhaust route formed between said second exhaust vent in the left side face and a left end of said first exhaust vent, with a longer distance when compared therebetween, is set to be longer than the projecting length of the second water stop member located on the exhaust route of a shorter distance.

19. The outdoor-installed power conditioner according to claim 14, wherein said enclosure is mounted on a joining surface by locking said enclosure to the exhaust channel forming member fixed on the joining surface.

20. The outdoor-installed power conditioner according to claim 14, wherein the air exhausted from said first exhaust vent is guided by a backside of an inclined top panel forming the top face of said exhaust channel forming member, and introduced to a lower part of said exhaust channel.

* * * * *